US012464702B2

(12) United States Patent
Varghese et al.

(10) Patent No.: US 12,464,702 B2
(45) Date of Patent: Nov. 4, 2025

(54) THREE-DIMENSIONAL DYNAMIC RANDOM-ACCESS MEMORY (3D DRAM) GATE ALL-AROUND (GAA) DESIGN USING STACKED Si/SiGe

(71) Applicant: Applied Materials, Inc., Santa Clara, CA (US)

(72) Inventors: Sony Varghese, Manchester-by-the-Sea, MA (US); Fredrick David Fishburn, Aptos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 874 days.

(21) Appl. No.: 17/564,486

(22) Filed: Dec. 29, 2021

(65) Prior Publication Data

US 2022/0344339 A1   Oct. 27, 2022

Related U.S. Application Data

(60) Provisional application No. 63/179,090, filed on Apr. 23, 2021.

(51) Int. Cl.
*H10B 12/00* (2023.01)
(52) U.S. Cl.
CPC ............. *H10B 12/30* (2023.02); *H10B 12/03* (2023.02); *H10B 12/05* (2023.02); *H10B 12/482* (2023.02)
(58) Field of Classification Search
CPC ........ H10B 12/03; H10B 12/05; H10B 12/30; H10B 12/482; H10B 12/488; H10D 30/6735; H10D 86/481; H10D 86/60
See application file for complete search history.

(56) References Cited

U.S. PATENT DOCUMENTS 10,008,583 B1   6/2018   Rodder et al.
10,014,318 B2   7/2018   Or-Bach et al.
(Continued)

FOREIGN PATENT DOCUMENTS

JP      2019068067 A      4/2019
JP      2019156842 A      9/2019
KR   10-2020-0007594      1/2020

OTHER PUBLICATIONS

International Search Report for PCT/US2022/025831, dated Aug. 17, 2022.

*Primary Examiner* — Britt D Hanley
*Assistant Examiner* — Kevin Quinto
(74) *Attorney, Agent, or Firm* — Moser Taboada

(57) ABSTRACT

Methods of forming a three-dimensional dynamic random-access memory (3D DRAM) structure are provided herein. In some embodiments, a method of forming a 3D DRAM structure includes forming at least one wordline feature in a first stack comprising a plurality of crystalline silicon (c-Si) layers alternating with a plurality of crystalline silicon germanium (c-SiGe) layers, wherein the wordline feature comprises: vertically etching a first pattern of holes; filling the first pattern of holes with a silicon germanium fill; vertically etching a plurality of isolation slots through the first stack; filling the plurality of isolation slots with a dielectric material to form an isolation layer between the silicon germanium fill; etching the silicon germanium fill and the plurality of c-SiGe layers to form a plurality of gate silicon channels comprising portions of the plurality of c-Si layers; and depositing a layer of conductive material that wraps around the plurality of gate silicon channels.

14 Claims, 22 Drawing Sheets

(56) References Cited

U.S. PATENT DOCUMENTS

| | | |
|---|---|---|
| 2005/0212026 A1 | 9/2005 | Chung et al. |
| 2013/0051150 A1 | 2/2013 | Roizin et al. |
| 2018/0350823 A1 | 12/2018 | Or-Bach et al. |
| 2019/0074277 A1 | 3/2019 | Ramaswamy |
| 2019/0152996 A1 | 5/2019 | Park et al. |
| 2019/0164985 A1 | 5/2019 | Lee et al. |
| 2019/0326123 A1 | 10/2019 | Li et al. |
| 2020/0083225 A1 | 3/2020 | Ma et al. |
| 2020/0083248 A1 | 3/2020 | Uchida |
| 2020/0111793 A1 | 4/2020 | Kim et al. |
| 2020/0279601 A1 | 9/2020 | Kim et al. |
| 2021/0013210 A1 | 1/2021 | Lee et al. |
| 2021/0057419 A1 | 2/2021 | Shin et al. |
| 2021/0082766 A1 | 3/2021 | Miura et al. |
| 2021/0104527 A1 | 4/2021 | Son |
| 2021/0143065 A1* | 5/2021 | Gardner ............... H10D 62/121 |
| 2023/0141135 A1 | 5/2023 | Lee et al. |

\* cited by examiner

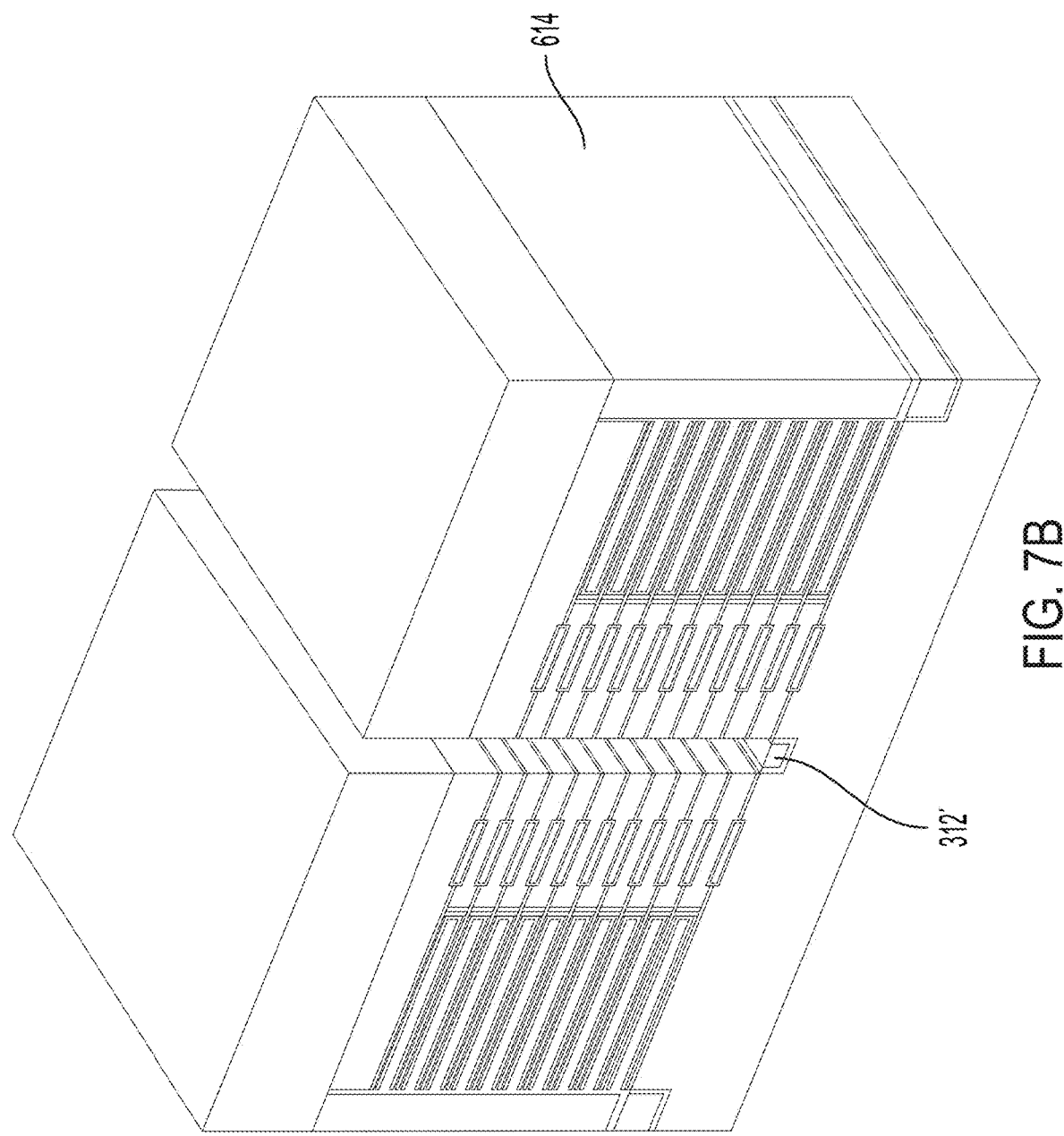

THREE-DIMENSIONAL DYNAMIC RANDOM-ACCESS MEMORY (3D DRAM) GATE ALL-AROUND (GAA) DESIGN USING STACKED Si/SiGe

CROSS-REFERENCE TO RELATED APPLICATIONS

This application claims benefit of U.S. provisional patent application Ser. No. 63/179,090, filed Apr. 23, 2021, which is herein incorporated by reference in its entirety.

FIELD

Embodiments of the present principles generally relate to semiconductor manufacturing.

BACKGROUND

The storage and retrieval of data has been a limiting factor for many aspects of the computing industry. Memory devices can easily throttle the overall performance of modern computing devices. To make memory faster, memory structures have been scaled down to miniscule sizes, dramatically increasing the density of the memory structures. Two-dimensional memory structures are starting to reach a theoretical limit with regard to the densities of the memory structures. The inventors have observed that three-dimensional memory structures may be used to further increase memory densities. However, three-dimensional memory devices require significant changes in the structure and processing compared to two-dimensional memory devices.

Accordingly, the inventors have provided methods and structures for three-dimensional memory with scalable dimensions that allow memory densities beyond the capabilities of current technologies.

SUMMARY

Methods of forming a three-dimensional dynamic random-access memory (3D DRAM) structure are provided herein. In some embodiments, a method of forming a three-dimensional dynamic random-access memory 3D DRAM includes forming at least one wordline feature in a first stack comprising a plurality of crystalline silicon (c-Si) layers alternating with a plurality of crystalline silicon germanium (c-SiGe) layers, wherein the wordline feature comprises: vertically etching a first pattern of holes through the first stack; filling the first pattern of holes with a silicon germanium fill having a concentration of germanium similar to a concentration of germanium in the plurality of c-SiGe layers; vertically etching a plurality of isolation slots through the first stack, splitting the silicon germanium fill in each of the first pattern of holes; filling the plurality of isolation slots with a dielectric material to form an isolation layer between the silicon germanium fill; etching the silicon germanium fill and the plurality of c-SiGe layers to form a plurality of gate silicon channels comprising portions of the plurality of c-Si layers; and depositing a layer of conductive material that wraps around the plurality of gate silicon channels.

In some embodiments, a method of forming a three-dimensional dynamic random-access memory (3D DRAM) structure includes forming a wordline feature in a first stack comprising a plurality of crystalline silicon (c-Si) layers alternating with a plurality of crystalline silicon germanium (c-SiGe) layers, wherein the wordline feature comprises: vertically etching a first pattern of holes through the first stack; filling the first pattern of holes with a silicon germanium fill having a concentration of germanium similar to a concentration of germanium in the plurality of c-SiGe layers; vertically etching a plurality of isolation slots through the first stack, splitting the silicon germanium fill in each of the first pattern of holes; filling the plurality of isolation slots with a dielectric material to form an isolation layer between the silicon germanium fill; etching the silicon germanium fill and the plurality of c-SiGe layers to form a plurality of gate silicon channels comprising portions of the plurality of c-Si layers; and depositing a layer of conductive material that wraps around the plurality of gate silicon channels; forming a bitline feature through the first stack extending between rows of the first pattern of holes; and forming a plurality of capacitor features in the first stack.

In some embodiments, a three-dimensional dynamic random-access memory (3D DRAM) structure includes at least one vertical wordline feature of the 3D DRAM structure formed in a first stack of alternating crystalline silicon (c-Si) layers and nitride layers wherein the at least one vertical wordline feature includes a plurality of gate silicon channels comprising a plurality of c-Si layers of the alternating c-Si layers, an oxide layer wrapped around each of the plurality of gas silicon channels, and a metal layer wrapped around the oxide layer to form a gate-all-around (GAA) structure; at least one horizontal bitline feature disposed perpendicular to the at least one vertical wordline feature; and a plurality of capacitor features extending horizontally from the at least one vertical wordline between the nitride layers.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 7B depicts an isometric view of the first stack after a vertical bitline slit etch process in accordance with at least some embodiments of the present disclosure.

Figure 1:
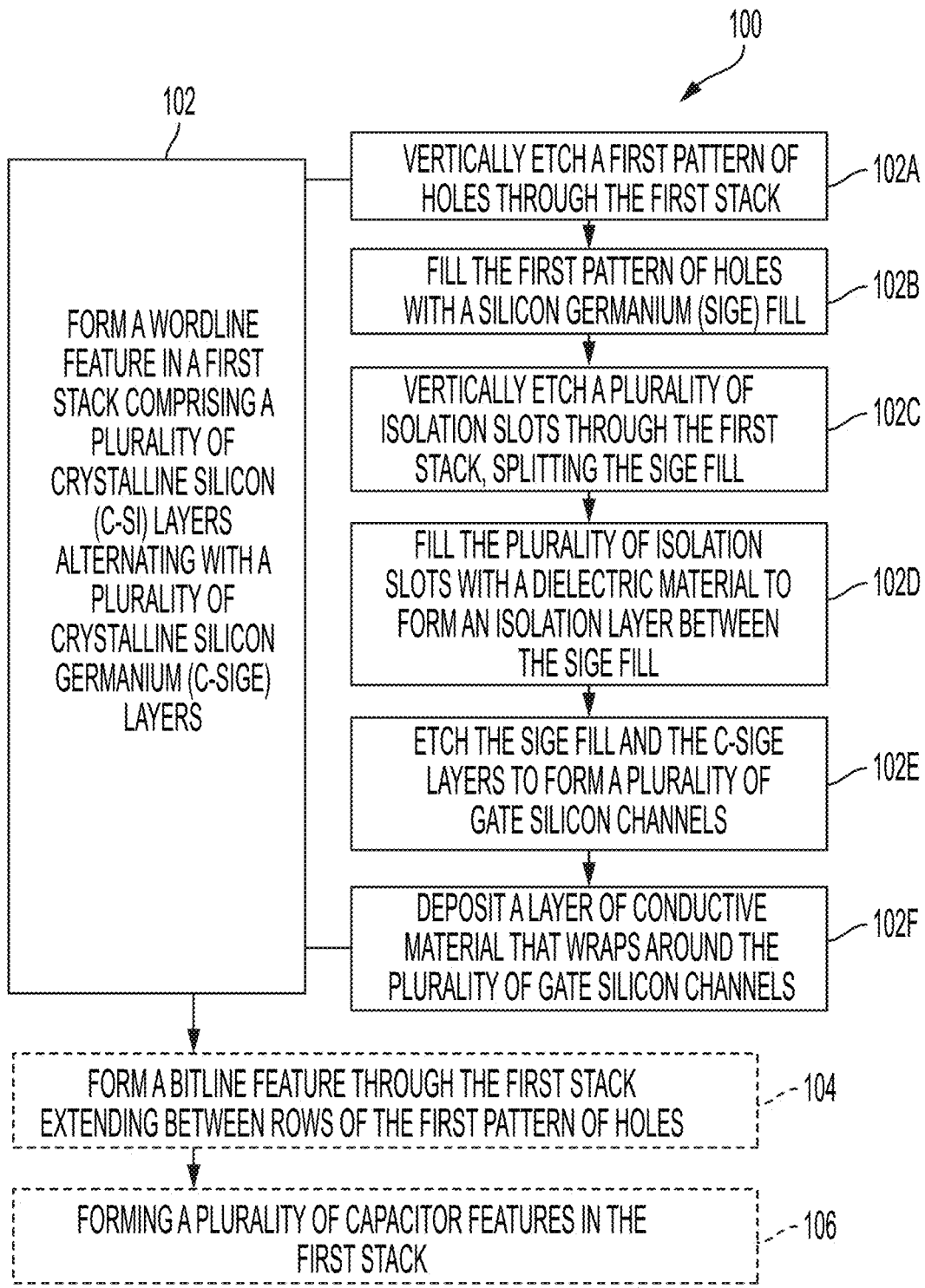
FIG. 1 depicts a flow chart of a method of forming a three-dimensional dynamic random-access memory (3D DRAM) structure in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and structures provided herein enable production of three-dimensional (3D) dynamic random-access memory (DRAM) cells that include gate-all-around (GAA) structures around crystalline silicon (c-Si) channels in order to get good control of the c-Si channels. Two-dimensional (2D) DRAM scaling is becoming very difficult to manufacture, and the cost is constantly increasing. Below the D1d DRAM node, the feature size will be so small that even self-aligned quadruple patterning (SAQP) will no longer be a viable option. Even if extreme ultraviolet (EUV) lithography is adopted, the EUV lithography will still need to be at least self-aligned double patterning (SADP), if not SAQP at most levels. Although 3D DRAM is a concept that has been investigated widely in the DRAM industry for D1d and beyond, proposed solutions cannot be processed with economical materials and processes at the dimensions needed to reach memory density comparable to 2D DRAM.

FIG. 1 depicts a flow chart of a method of forming a three-dimensional dynamic random-access memory (3D DRAM) structure in accordance with at least some embodiments of the present disclosure. At 102, a wordline feature is formed in a first stack comprising a plurality of crystalline silicon (c-Si) layers alternating with a plurality of crystalline silicon germanium (c-SiGe) layers to form a structure for 3D DRAM. The first stack may be formed by forming a first c-Si layer followed by a first c-SiGe layer. The process is repeated with a second c-Si layer followed by a second c-SiGe layer. Likewise, the layers continue to alternate to form as many layers as is needed for a particular structure or structures, allowing tremendous flexibility for memory structure design. For example, the first stack may comprise 50 or more layers. In some embodiments, the concentration of germanium in the c-SiGe layers may be between about 10 to about 35 atomic percent.

Figure 2A:
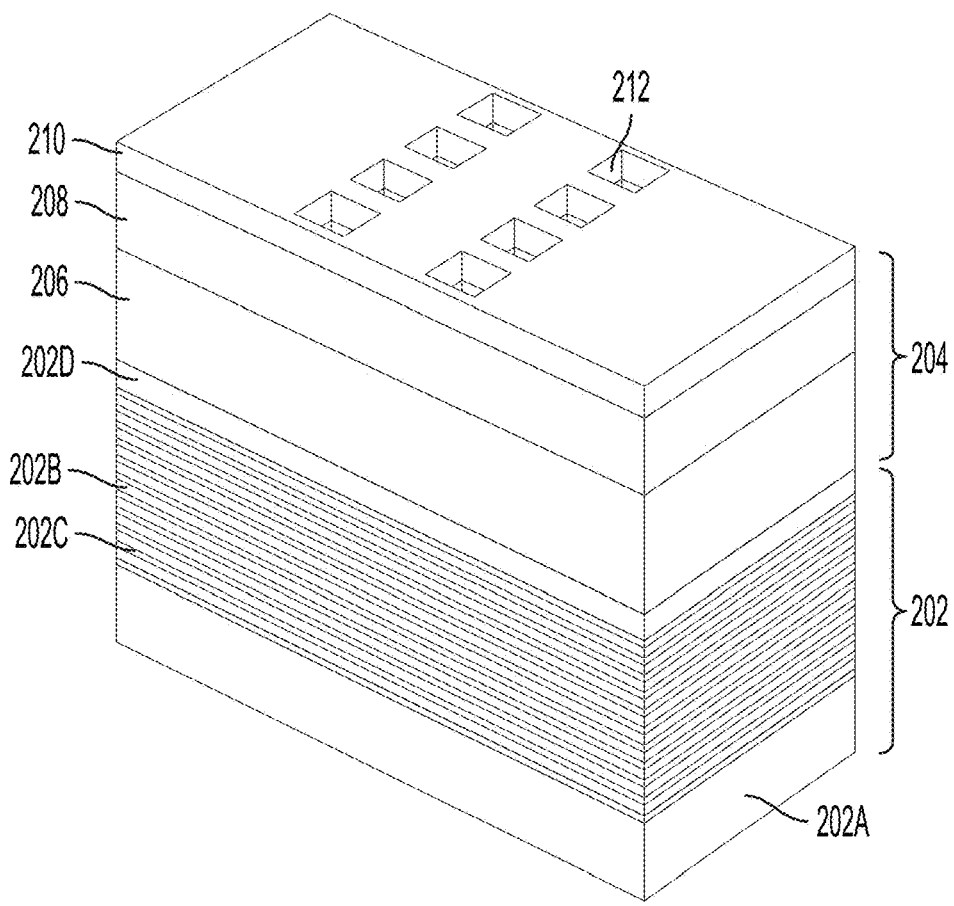
FIG. 2A depicts an isometric view of a first stack having a lithography stack with wordline hole patterning in accordance with at least some embodiments of the present disclosure.

FIG. 2A depicts an isometric view of a first stack 202 having a lithography stack 204 disposed thereon with a wordline hole pattern 212 in accordance with at least some embodiments of the present disclosure. The first stack 202 represents a portion of the overall 3D DRAM structure that may be extended/repeated length-wise and width-wise to form the overall 3D DRAM structure. In some embodiments, the first stack 202 includes a base c-Si layer 202A, and the alternating c-Si layers 202B and c-SiGe layers 202C are disposed on the base c-Si layer 202A. In some embodiments, the base c-Si layer 202A has a thickness greater than the c-SiGe layers 202C. In some embodiments, the first stack 202 includes a top c-SiGe layer 202D corresponding with a top of the first stack 202. In some embodiments, the top c-SiGe layer 202D has a thickness greater than the c-SiGe layers 202C. In some embodiments, the c-Si layer 202B of the first stack 202 may have a thickness of approximately 20 to approximately 60 nm. In some embodiments, the c-SiGe layer 202C of the first stack 202 may have a thickness of approximately 5 nm to approximately 20 nm. In some embodiments, the c-Si layer 202B may have a thickness of approximately 50 nm and a c-SiGe layer 202C may have a thickness of approximately 10 nm. The thicknesses may vary based upon the design of a given memory structure.

In some embodiments, the first stack is deposited onto a substrate using a heteroepitaxy process. The substrate may comprise a layer of c-Si or any other suitable material. By using an alternating heteroepitaxy of silicon and silicon germanium, many layers of memory cells may be easily constructed with high cost-efficiency. Various etch and fill processes may be performed on the first stack to form 3D DRAM features such as wordlines, bitlines, capacitors, or the like. In some embodiments, the wordlines are vertical wordlines and the bitlines are horizontal bitlines.

Figure 2B:
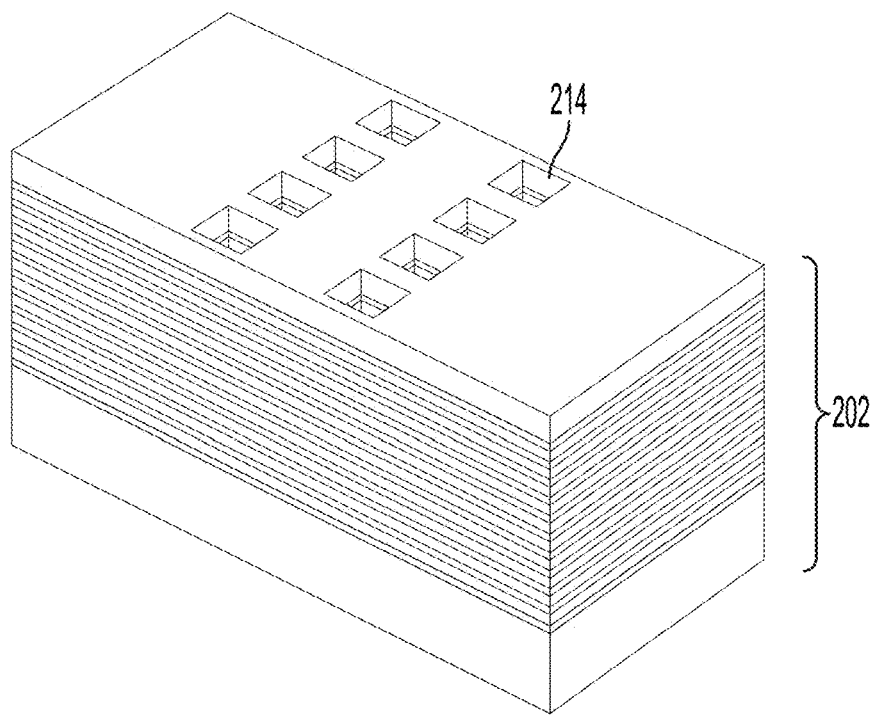
FIG. 2B depicts an isometric view of the first stack after wordline hole formation in accordance with at least some embodiments of the present disclosure.

At 102A, forming the wordline feature includes vertically etching a first pattern of holes 214 through the first stack 202, for example, etching via the wordline hole pattern 212. Through the first stack 202 refers to at least through the top c-SiGe layer 202D, the alternating c-Si layers 202B and c-SiGe layers 202C, and at least partially through the base c-Si layer 202A, for example about 50 nm into the base c-Si layer 202A. Vertically etching refers to etching in a direction generally perpendicular to the horizontal planes of the layers of the first stack 202. The lithography stack 204 may comprise one or more layers of material suitable for performing an etch process on the first stack 202. For example, the lithography stack 204 may include a hard mask 210 disposed on an oxide mask 208 that is disposed on a carbon mask 206. FIG. 2B depicts an isometric view of the first stack 202 after wordline hole formation in accordance with at least some embodiments of the present disclosure. The vertically etching of the first pattern of holes 214 may be a non-selective etch that etches both c-Si and c-SiGe. The wordline hole pattern 212 may be any suitable pattern and may, for example, comprise a plurality of circular shapes, rectangular shapes, square shapes, or any other suitable shapes.

Figure 2C:
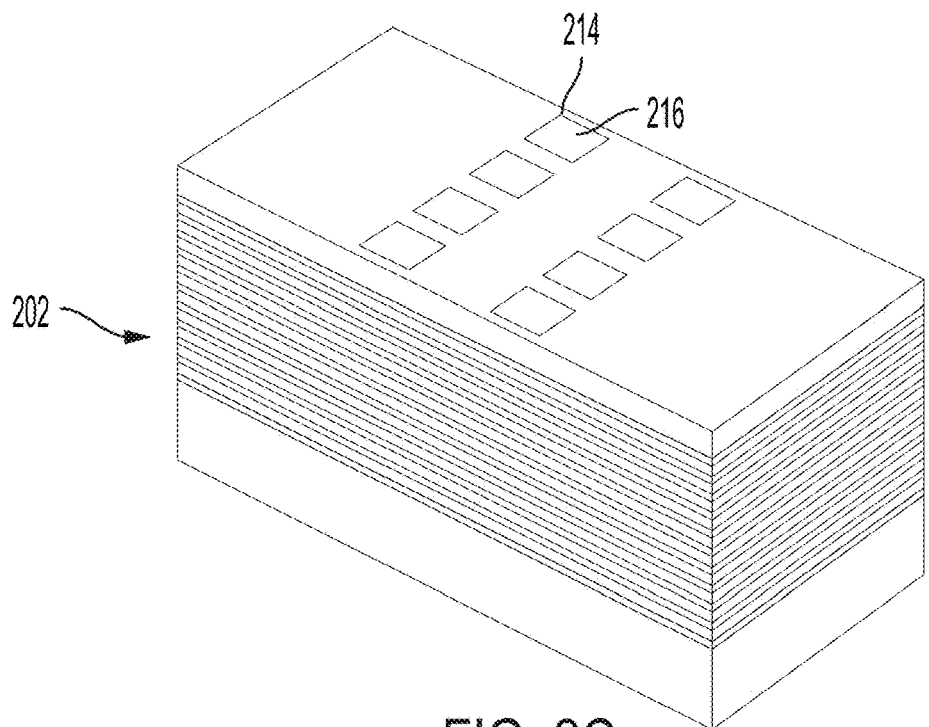
FIG. 2C depicts an isometric view of the first stack after gap filling the wordline hole formation in accordance with at least some embodiments of the present disclosure.

At 102B, forming the wordline feature further includes filling the first pattern of holes 214 with a silicon germanium (SiGe) fill (e.g., SiGe fill 216) having a concentration of germanium similar to a concentration of germanium in the plurality of c-SiGe layers. For example, in some embodiments, the concentration of germanium in the SiGe fill may be within about 10 percent of the concentration of germanium in the c-SiGe layers 202C. FIG. 2C depicts an isometric view of the first stack 202 after gap filling the wordline hole formation with the SiGe fill 216 in accordance with at least some embodiments of the present disclosure. In some embodiments, the SiGe fill 216 is deposited via a chemical vapor deposition (CVD) process. In some embodiments, the SiGe fill 216 comprises an amorphous SiGe fill.

Figure 2D:
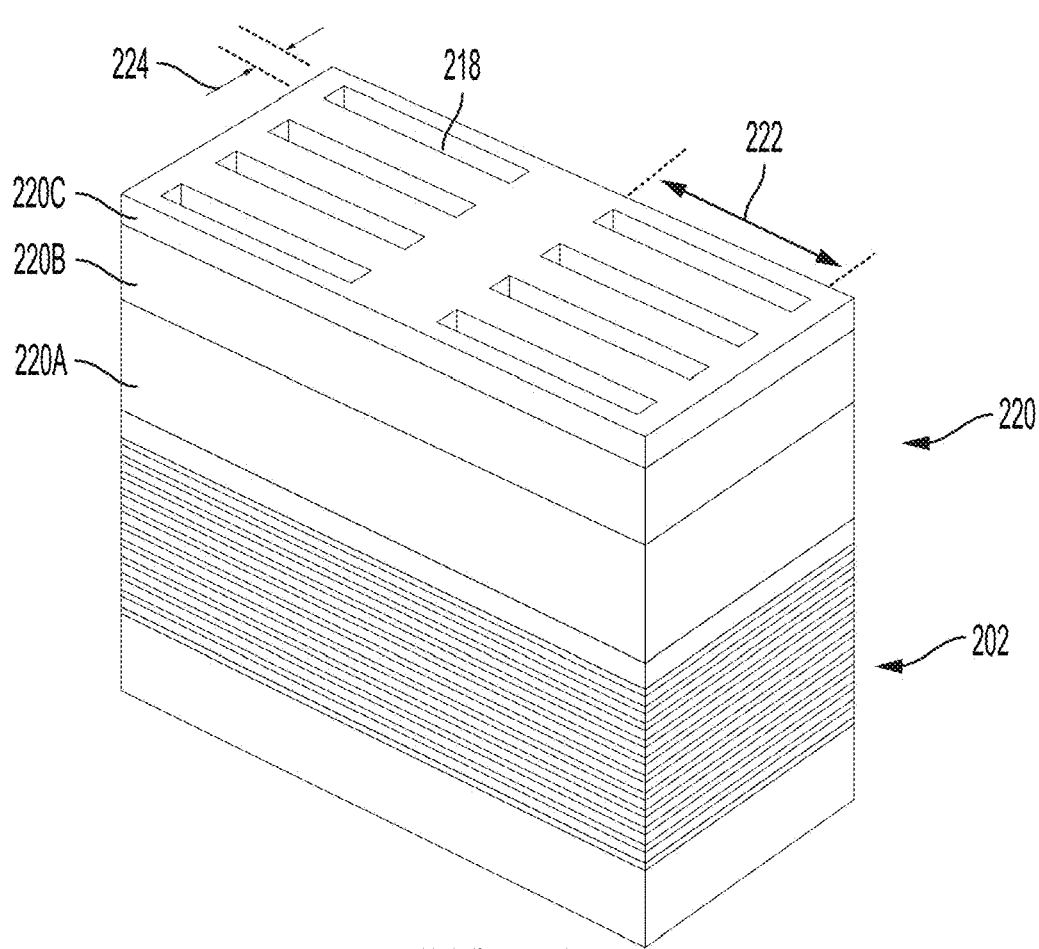
FIG. 2D depicts an isometric view of the first stack having a lithography stack with isolation slot patterning in accordance with at least some embodiments of the present disclosure.

At 102C, forming the wordline feature further includes vertically etching a plurality of isolation slots (e.g., isolation slots 226) through the first stack and through the SiGe fill, splitting the silicon germanium fill in each of the first pattern of holes. Having a similar concentration of germanium in the c-SiGe layers 202C and the SiGe fill 216 advantageously facilitates more uniform etching of the plurality of isolation slots. FIG. 2D depicts an isometric view of the first stack 202 having a lithography stack 220 with isolation slot patterns 218 in accordance with at least some embodiments of the present disclosure. The lithography stack 220 may comprises layers similar to the lithography stack 204. For example, the lithography stack 220 may include a hard mask 220C disposed on an oxide mask 220B that is disposed on a carbon mask 220A. In some embodiments, as shown in FIG. 2D, the isolation slot patterns 218 have a length 222 greater than a length of the wordline hole pattern 212 and a width 224 less than a width of the wordline hole pattern 212. In some embodiments, the plurality of isolation slots 226 and the first pattern of holes 214 are substantially coplanar along one of their sides.

Figure 2E:
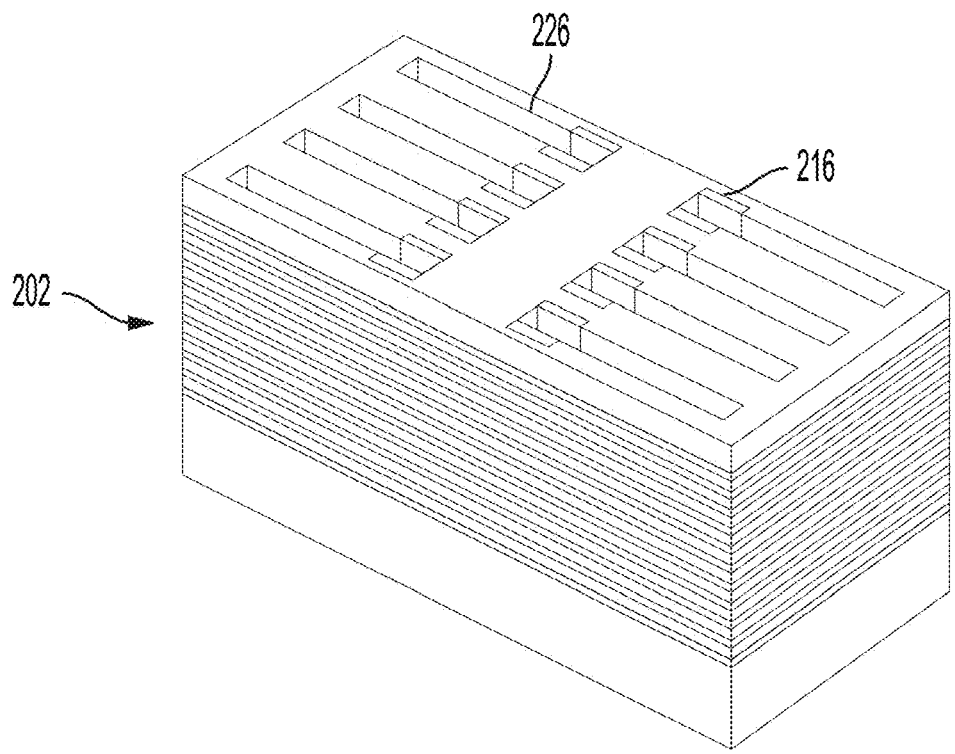
FIG. 2E depicts an isometric view of the first stack after isolation slot formation in accordance with at least some embodiments of the present disclosure.

FIG. 2E depicts an isometric view of the first stack after isolation slot formation in accordance with at least some embodiments of the present disclosure. The vertically etching of the plurality of isolation slots 226 via the isolation slot patterns 218 may be a non-selective etch that etches both c-Si and c-SiGe. The plurality of isolation slots 226 are sized to split the SiGe fill 216 for further downstream processes of forming the wordline feature. In some embodiments, the plurality of isolation slots 226 extend into the first stack 202 at a depth similar to a depth of the first pattern of holes 214. In other words, the plurality of isolation slots 226 and the first pattern of holes 214 may be etched to a similar amount.

Figure 2F:
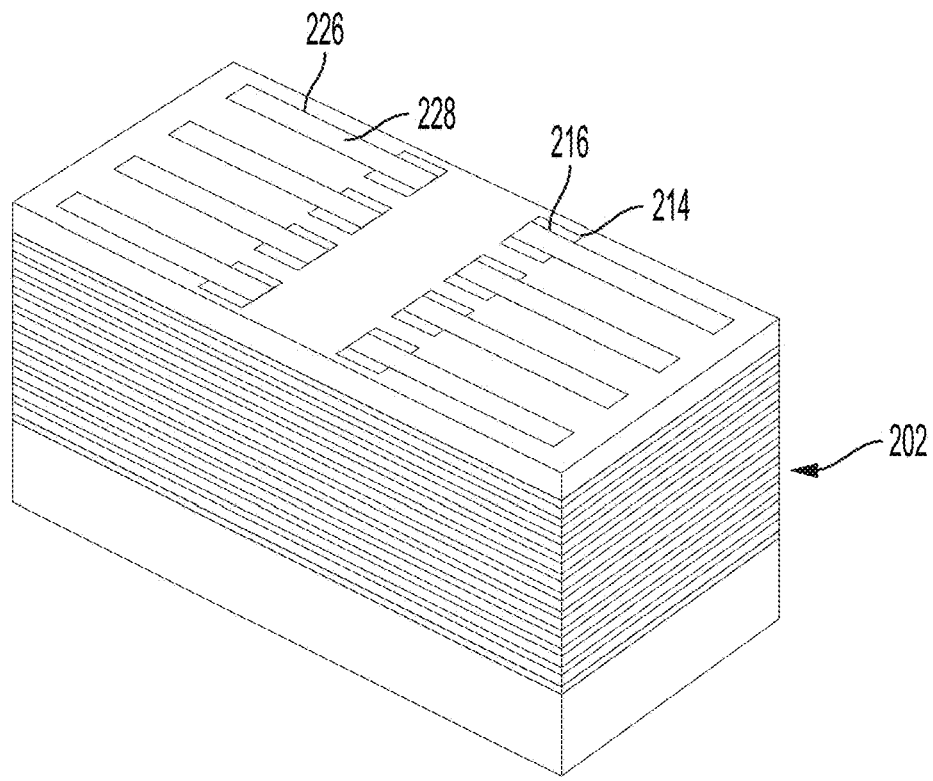
FIG. 2F depicts an isometric view of the first stack after gap filling the isolation slots in accordance with at least some embodiments of the present disclosure.

At 102D, forming the wordline feature further includes filling the plurality of isolation slots with a dielectric material to form an isolation layer (e.g., isolation layer 228) between the silicon germanium fill. FIG. 2F depicts an isometric view of the first stack 202 after gap filling the isolation slots 226 with an isolation layer 228 in accordance with at least some embodiments of the present disclosure. The isolation layer 228 may comprise essentially of a dielectric material. In some embodiments, the isolation layer 228 consists of silicon oxide, silicon nitride, or silicon glass.

Figure 3A:
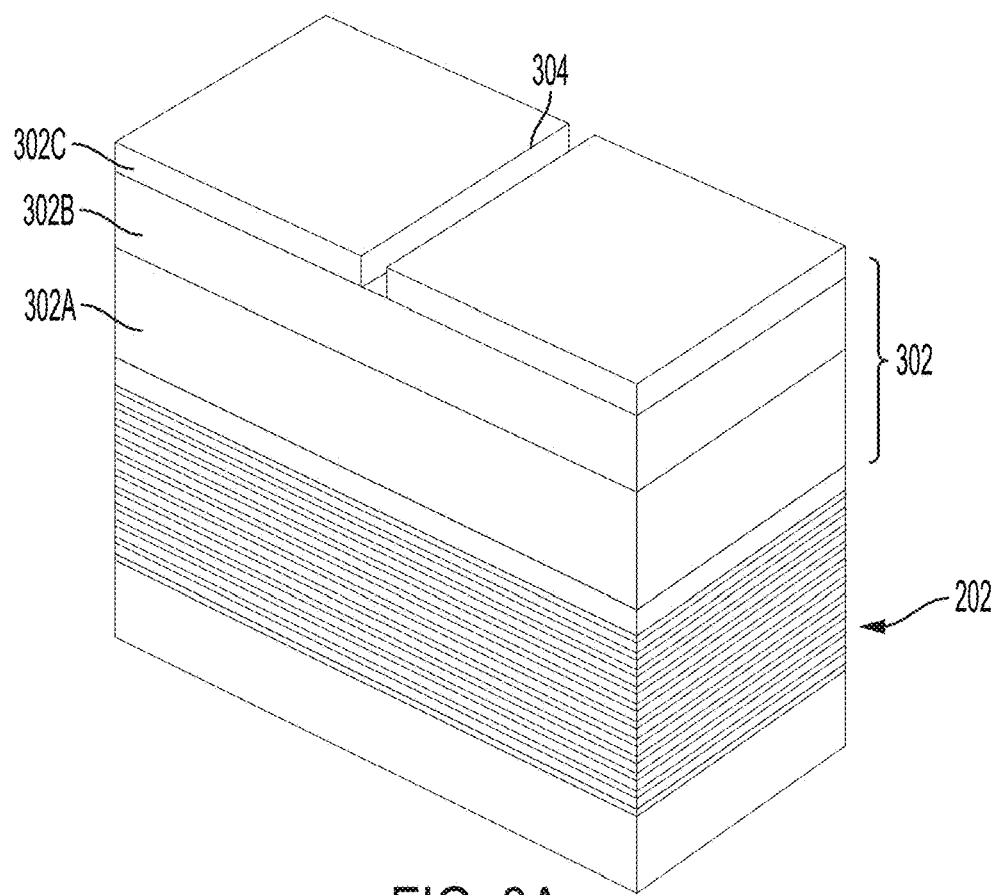
FIG. 3A depicts an isometric view of the first stack having a lithography stack with bitline slit patterning in accordance with at least some embodiments of the present disclosure.
Figure 3B:
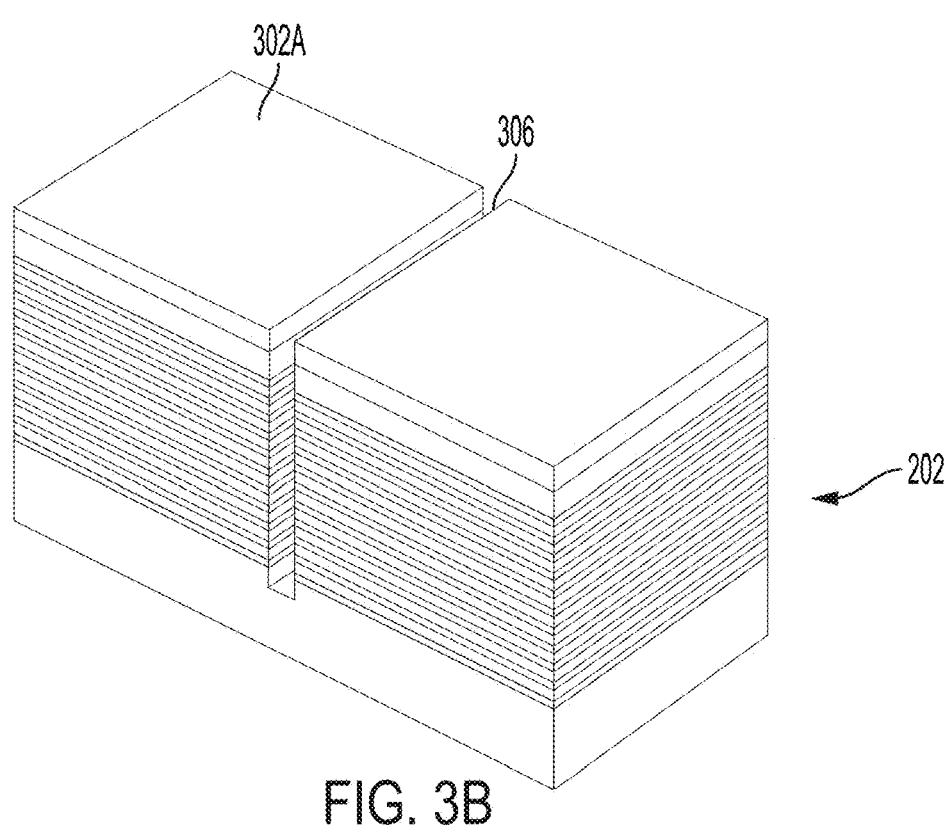
FIG. 3B depicts an isometric view of the first stack after bitline slit formation in accordance with at least some embodiments of the present disclosure.

In some embodiments, at 104, the method 100 includes forming a bitline feature through the first stack extending between rows of the first pattern of holes. FIG. 3A depicts an isometric view of the first stack 202 having a lithography stack with bitline slit patterns in accordance with at least some embodiments of the present disclosure. While the first stack 202 is shown to have a bitline slit 304 that is single, the 3D DRAM structure may have a plurality of bitline slits as the first stack structure repeats/extends width-wise to form the overall 3D DRAM structure. In some embodiments, the bitline feature is a horizontal bitline feature. In some embodiments, forming the bitline feature comprises placing a lithography stack 302 having a bitline slit 304 on the first stack 202, where the lithography stack 302 may comprise layers similar to the lithography stack 204. For example, the lithography stack 302 may include a hard mask 302C disposed on an oxide mask 302B that is disposed on a carbon mask 302A. Forming the bitline feature further comprises etching a bitline slit 306 through the first stack 202 as shown in FIG. 3B. FIG. 3B depicts an isometric view of the first stack 202 after bitline slit formation in accordance with at least some embodiments of the present disclosure. In some embodiments, a portion of the lithography stack 204, for example, a portion of the carbon mask 302A may remain after the bitline slit formation to downstream processing.

Figure 3C:
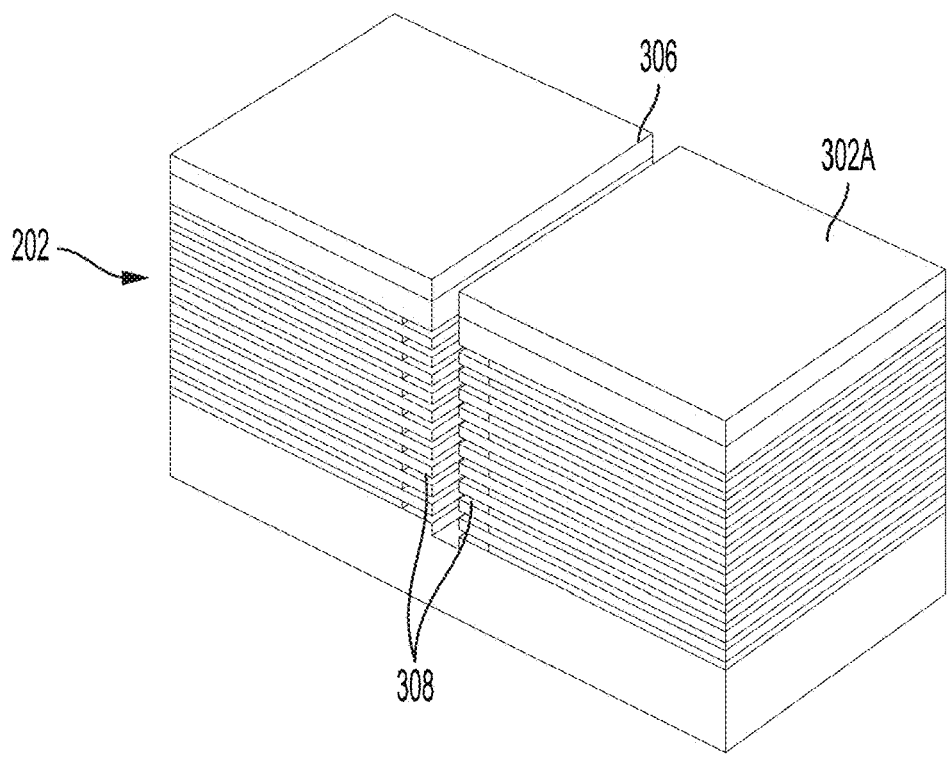
FIG. 3C depicts an isometric view of the first stack after bitline slit lateral etch in accordance with at least some embodiments of the present disclosure.

In some embodiments, forming the bitline feature further comprises replacing the c-SiGe layers 202C, which may be conductive, proximate the bitline slit 306 with an insulative material. In some embodiments, replacing the c-SiGe layers 202C proximate the bitline slit 306 starts with performing a lateral etch of the plurality of c-SiGe layers 202C from the bitline slit 306 to form recesses 308 for isolation layers (see bitline isolation layers 310 of FIG. 3D) of the 3D DRAM structure. The recesses 308 may be formed by using a selective removal process (SRP) to selectively remove only the SiGe. The carbon mask 302A may be used to protect the top c-SiGe layer 202D from the SRP of the SiGe. By adjusting the selective removal process, the amount of lateral etching may be precisely controlled. Lateral etch refers to etching in a direction substantially parallel to the c-SiGe layers 202C. FIG. 3C depicts an isometric view of the first stack 202 after bitline slit lateral etch in accordance with at least some embodiments of the present disclosure. In some embodiments, the c-SiGe layers 202C are laterally etched from the bitline slit 306 to a location abutting the SiGe fill 216.

Figure 3D:
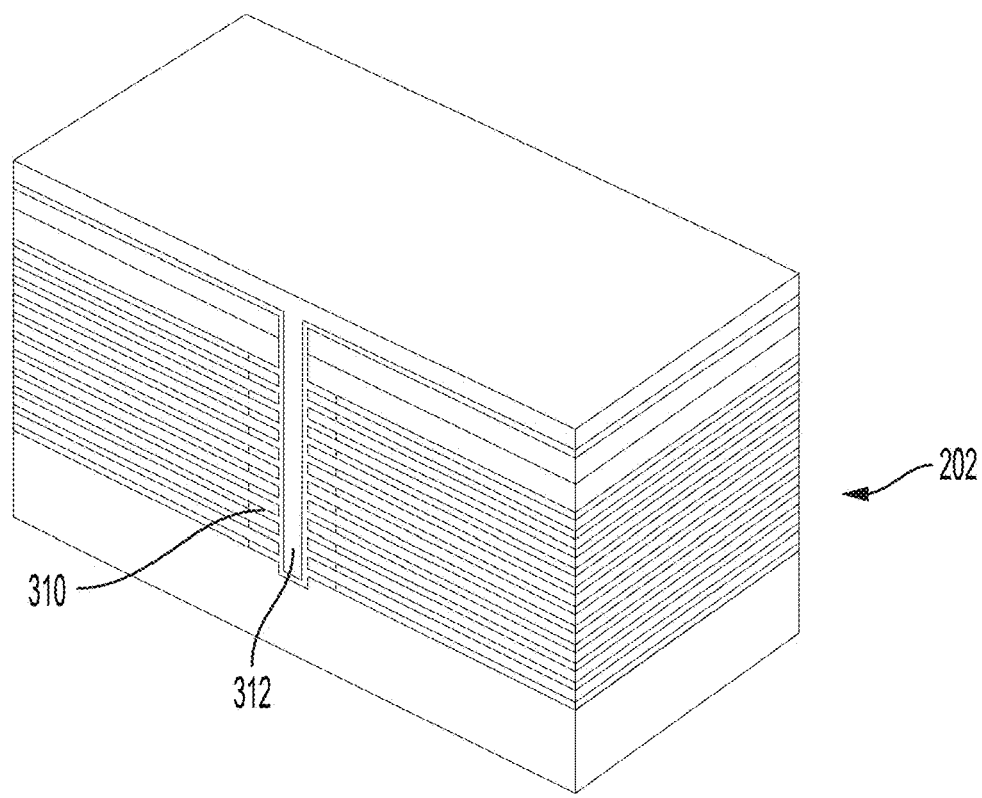
FIG. 3D depicts an isometric view of the first stack after depositing a nitride layer in the recesses formed by the bitline slit lateral etch and a sacrificial fill in the bitline slit in accordance with at least some embodiments of the present disclosure.

In some embodiments, forming the bitline feature further comprises depositing bitline isolation layers 310 in the recesses 308 formed by the bitline lateral etch. The bitline isolation layers 310 comprise a dielectric material and replace the laterally etched c-SiGe layers 202C proximate the bitline slit 306. In some embodiments, the bitline isolation layers 310 are nitride layers, for example, titanium nitride (TiN). In some embodiments, the bitline isolation layers 310 are deposited via an atomic layer deposition (ALD) process. In some embodiments, forming the bitline feature further comprises depositing a sacrificial fill 312 in the bitline slit 306. FIG. 3D depicts an isometric view of the first stack 202 after depositing the bitline isolation layers 310 in the recesses 308 and performing a sacrificial fill 312 in the bitline slit 306 in accordance with at least some embodiments of the present disclosure. The bitline isolation layers 310 provide a skeletal backbone to support the bitline features formed within the 3D DRAM. The sacrificial fill 312 may comprise essentially of a dielectric material. In some embodiments, the sacrificial fill 312 consists of silicon oxide, silicon nitride, or silicon glass.

Figure 4A:
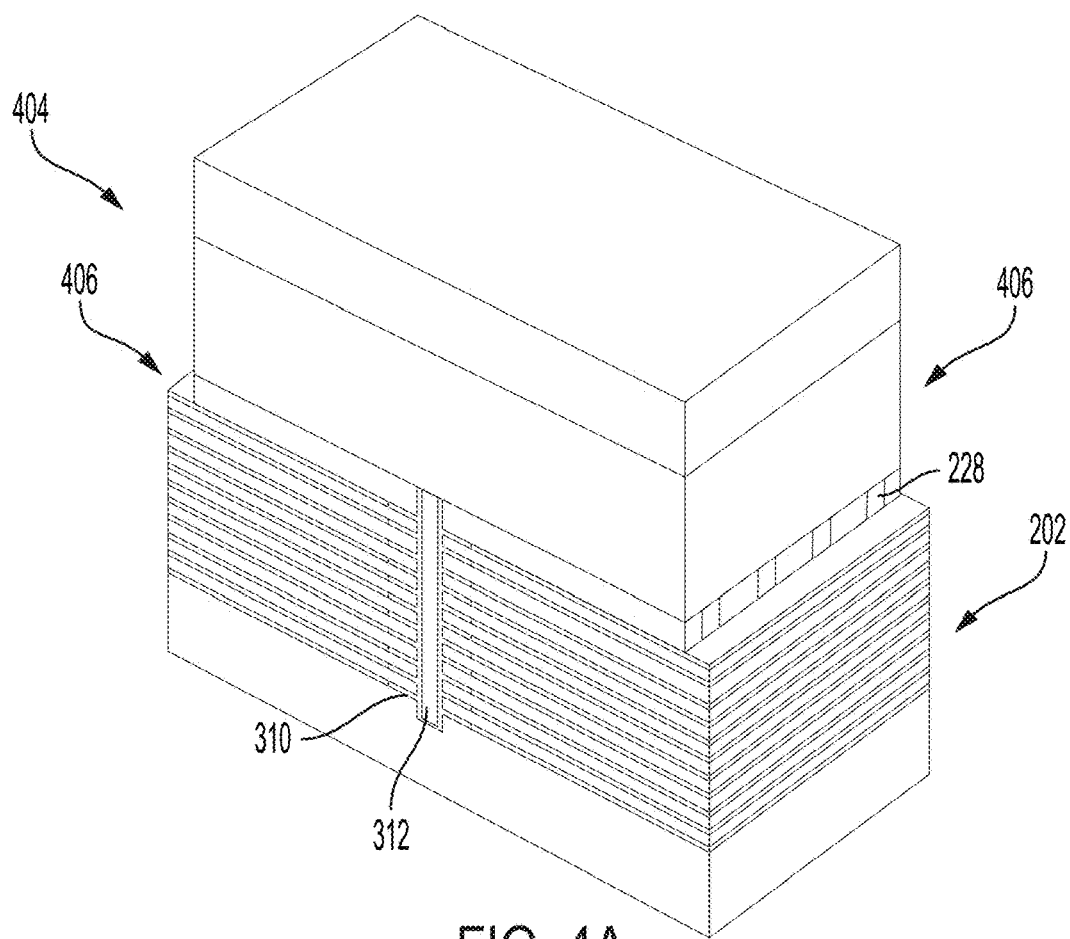
FIG. 4A depicts an isometric view of the first stack having a hard mask with capacitor slit patterning in accordance with at least some embodiments of the present disclosure.
Figure 4B:
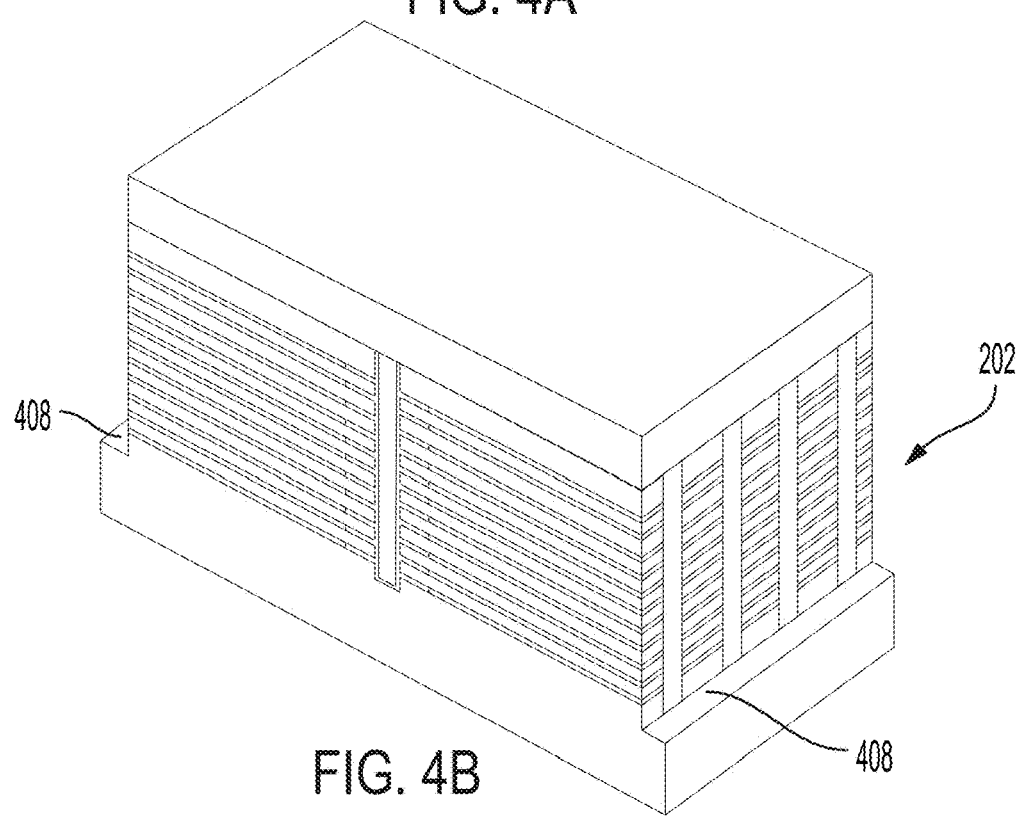
FIG. 4B depicts an isometric view of the first stack after capacitor slit formation in accordance with at least some embodiments of the present disclosure.

In some embodiments, at 106, the method 100 includes forming a plurality of capacitor features in the first stack 202. Forming the plurality of capacitor features in the first stack 202 may begin by placing one or more masks 404 with capacitor slit patterning 406 on the first stack 202 as depicted in FIG. 4A. Forming the plurality of capacitor features continues by next etching a capacitor slit 408 through the first stack 202 as depicted in FIG. 4B. In some embodiments, the capacitor slit 408 is etched via a non-selective etch, similar to the bitline slit 306 formation. In some embodiments, the capacitor slit 408 is formed after depositing the sacrificial fill 312 in the bitline slit 306.

Figure 4C:
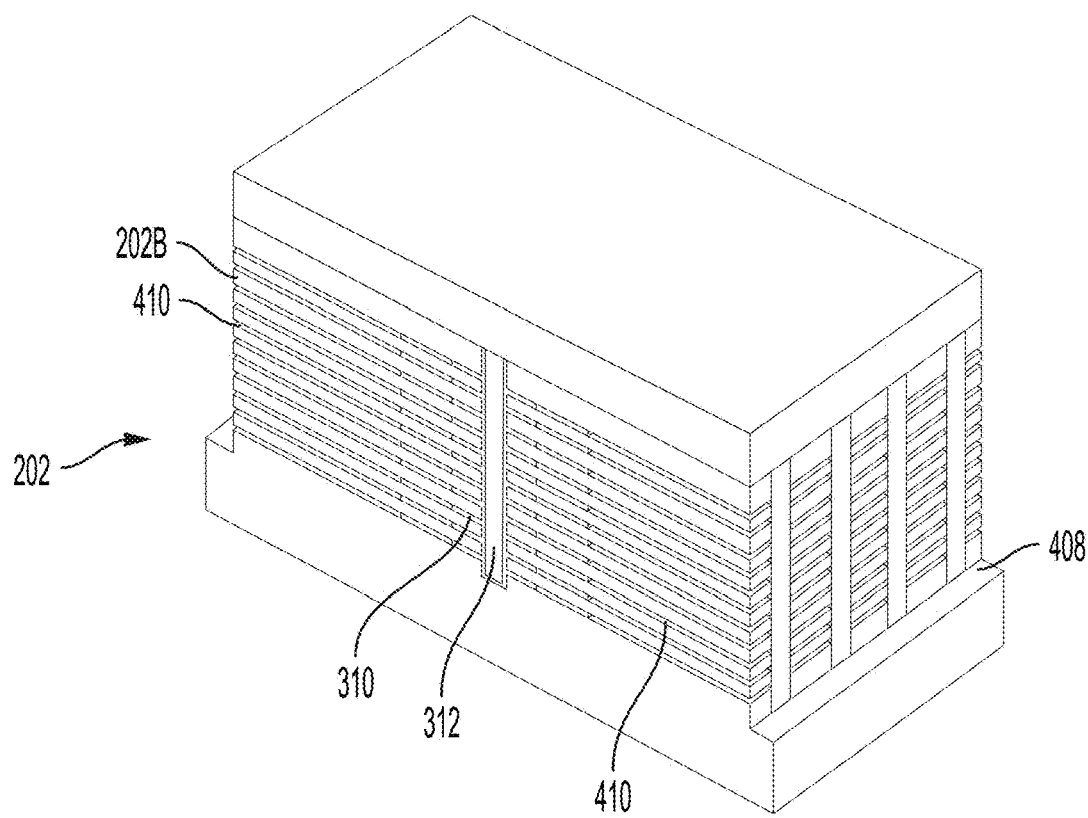
FIG. 4C depicts an isometric view of the first stack after capacitor slit lateral etch in accordance with at least some embodiments of the present disclosure.

Next, in some embodiments, forming the plurality of capacitor features comprises performing a lateral etch of the plurality of c-SiGe layers 202C from the capacitor slit 408 to form recesses 410 for isolation layers (see capacitor isolation layers 412 of FIG. 4D) of the 3D DRAM structure. The lateral etch is performed via an SRP process to selectively remove only the c-SiGe and not the c-Si. FIG. 4C depicts an isometric view of the first stack 202 after capacitor slit lateral etch in accordance with at least some embodiments of the present disclosure. In some embodiments, the c-SiGe layers 202C are etched back from the capacitor slit 408 until the SiGe fill 216.

Figure 4D:
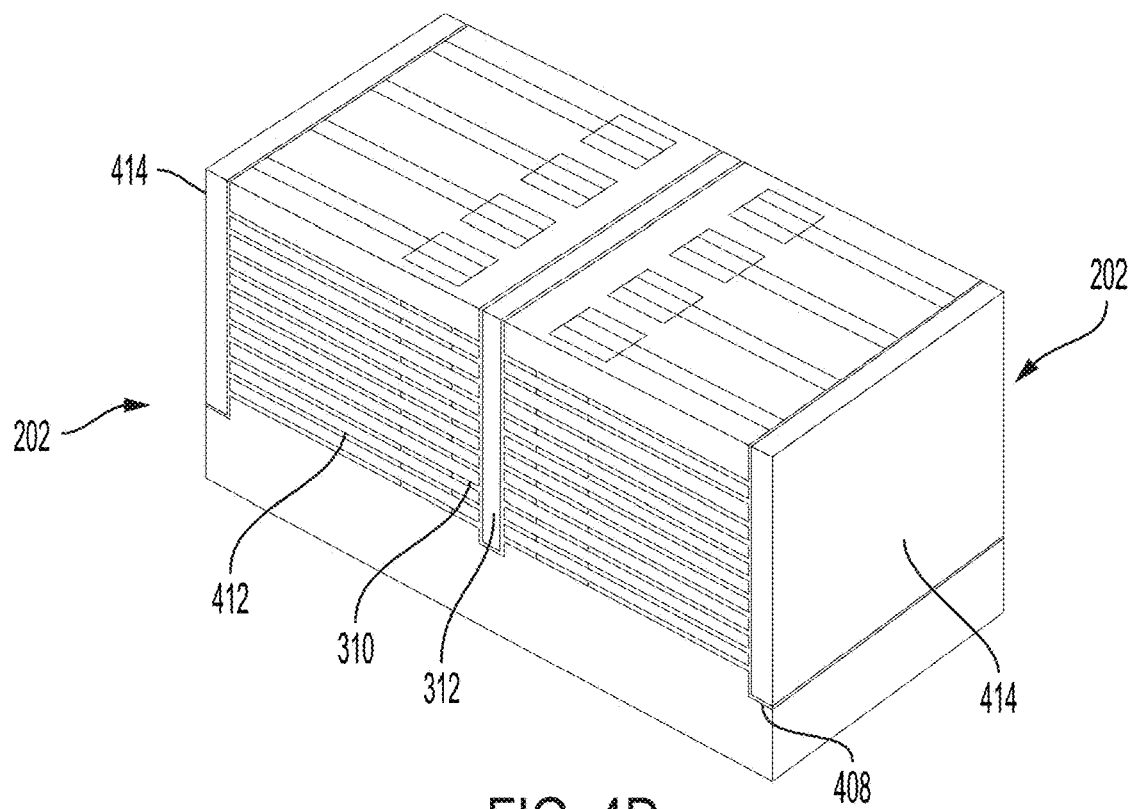
FIG. 4D depicts an isometric view of the first stack after performing a sacrificial fill in the capacitor slit and the recesses formed by the capacitor slit lateral etch in accordance with at least some embodiments of the present disclosure.

In some embodiments, forming the capacitor features further comprises depositing capacitor isolation layers 412 in the recesses 410 formed after the lateral etch of the c-SiGe layers from the capacitor slit 408. The capacitor isolation layers 412 comprise a dielectric material that fills the recesses 410. In some embodiments, the capacitor isolation layers 412 are oxide or nitride layers, for example, aluminum oxide ($Al_2O_3$) or titanium nitride (TiN). In some embodiments, the capacitor isolation layers 412 are deposited via an atomic layer deposition (ALD) process. In some embodiments, forming the capacitor feature further comprises depositing a sacrificial fill 414 in each capacitor slit 408. FIG. 4D depicts an isometric view of the first stack 202 after depositing the capacitor isolation layers 412 in the recesses 410 and performing a sacrificial fill 414 in the capacitor slit 408 in accordance with at least some embodiments of the present disclosure. The capacitor isolation layers 412 provide a skeletal backbone to support the capacitor features formed within the 3D DRAM. The sacrificial fill 414 may comprise essentially of a dielectric material. In some embodiments, the sacrificial fill 414 consists of silicon oxide, silicon nitride, or silicon glass. A planarization process may be performed after deposition of the sacrificial fill 414.

Figure 5A:
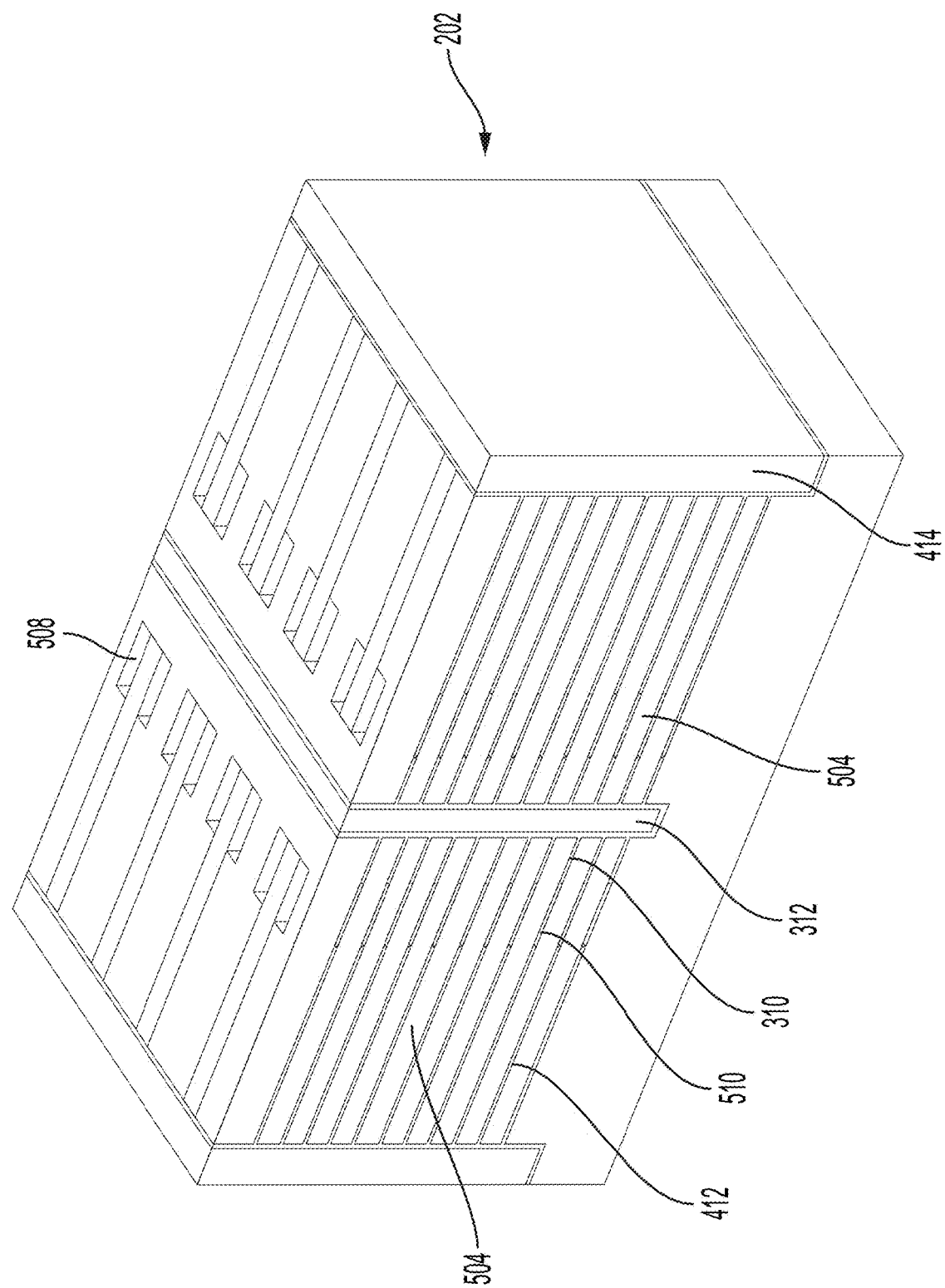
FIG. 5A depicts an isometric view of the first stack after performing a SiGe vertical and lateral etch of wordline replacement in accordance with at least some embodiments of the present disclosure.

Referring back to 102, in some embodiments, at 102E, forming the wordline features in the first stack 202 further comprises etching the SiGe fill 216 and the c-SiGe layers 202C between the bitline isolation layers 310 and the capacitor isolation layers 412. FIG. 5A depicts an isometric view of the first stack 202 after performing a SiGe vertical and lateral etch of wordline replacement in accordance with at least some embodiments of the present disclosure. The vertical and lateral etch forms vertical recesses 508 and horizontal recesses 510 about a plurality of gate silicon channels 504 (i.e., recesses that wrap around each of the gate silicon channels 504 to lay groundwork for GAA structures). In some embodiments, the plurality of gate silicon channels 504 comprise portions of the plurality of c-Si layers 202B disposed horizontally between the bitline isolation layers 310 and the capacitor isolation layers 412. In some embodiments, the SiGe fill 216 and the c-SiGe layers 202C are etched via an SRP process to selectively remove only the SiGe. In some embodiments, after etching the SiGe fill 216 and the c-SiGe layers 202C between the bitline isolation layers 310 and the capacitor isolation layers 412, all of the SiGe (from both SiGe fill 216 and c-SiGe layers 202C) is removed from the first stack 202.

Figure 5B:
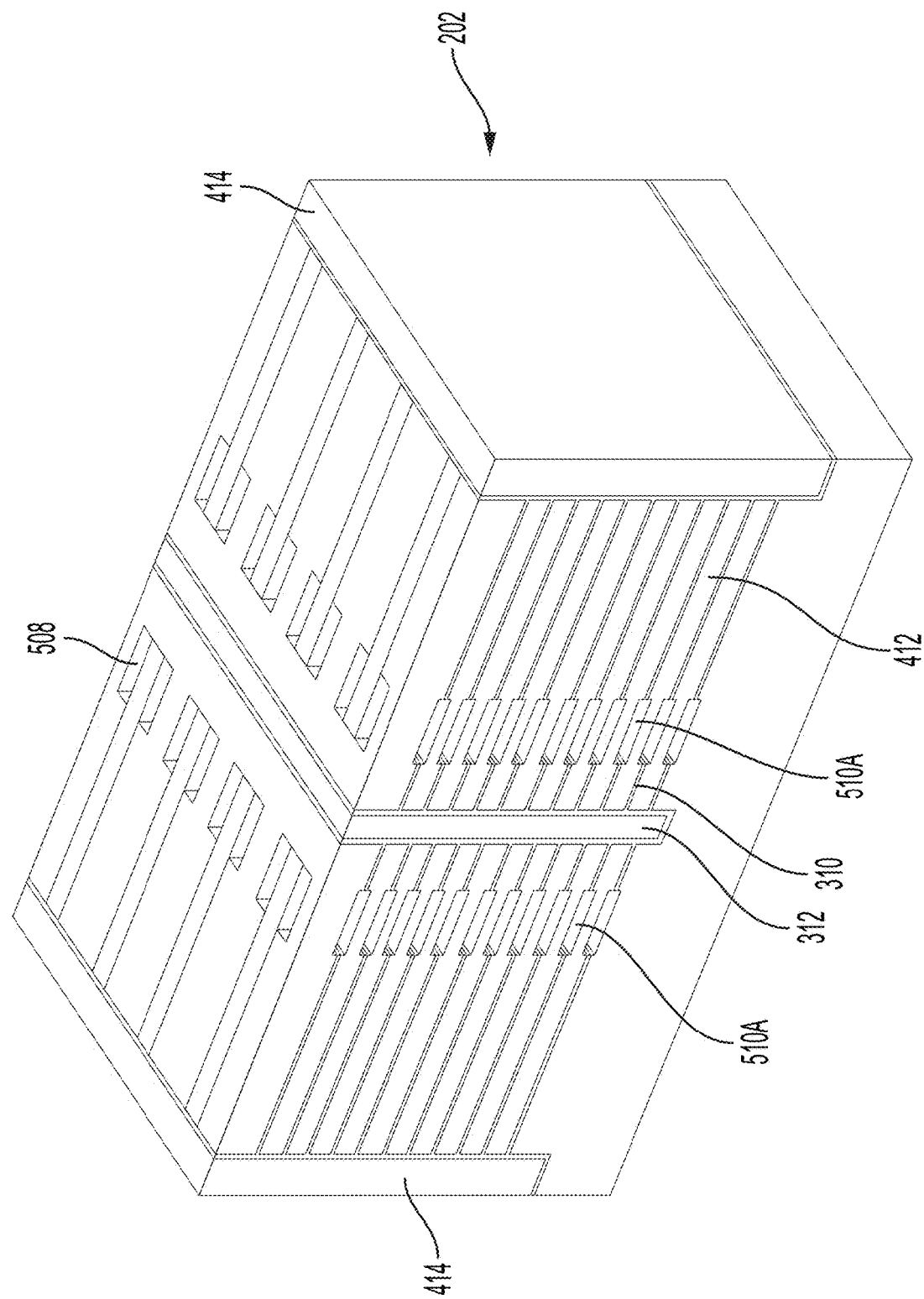
FIG. 5B depicts an isometric view of the first stack after performing a thinning Si etch for wordline replacement in accordance with at least some embodiments of the present disclosure.

In some embodiments, after etching the SiGe fill 216 and the c-SiGe layers 202C, the c-Si layers comprising the plurality of gate silicon channels 504 may be etched to widen a gap between the c-Si layers as shown in FIG. 5B. FIG. 5B depicts an isometric view of the first stack 202 after performing a thinning Si etch for wordline replacement in accordance with at least some embodiments of the present disclosure. The etch may be an SRP process to selectively remove about 3 to about 8 nm of c-Si. In some embodiments, the etch is a lateral etch so that the horizontal recesses 510 are enlarged to the horizontal recesses 510A.

Figure 5C:
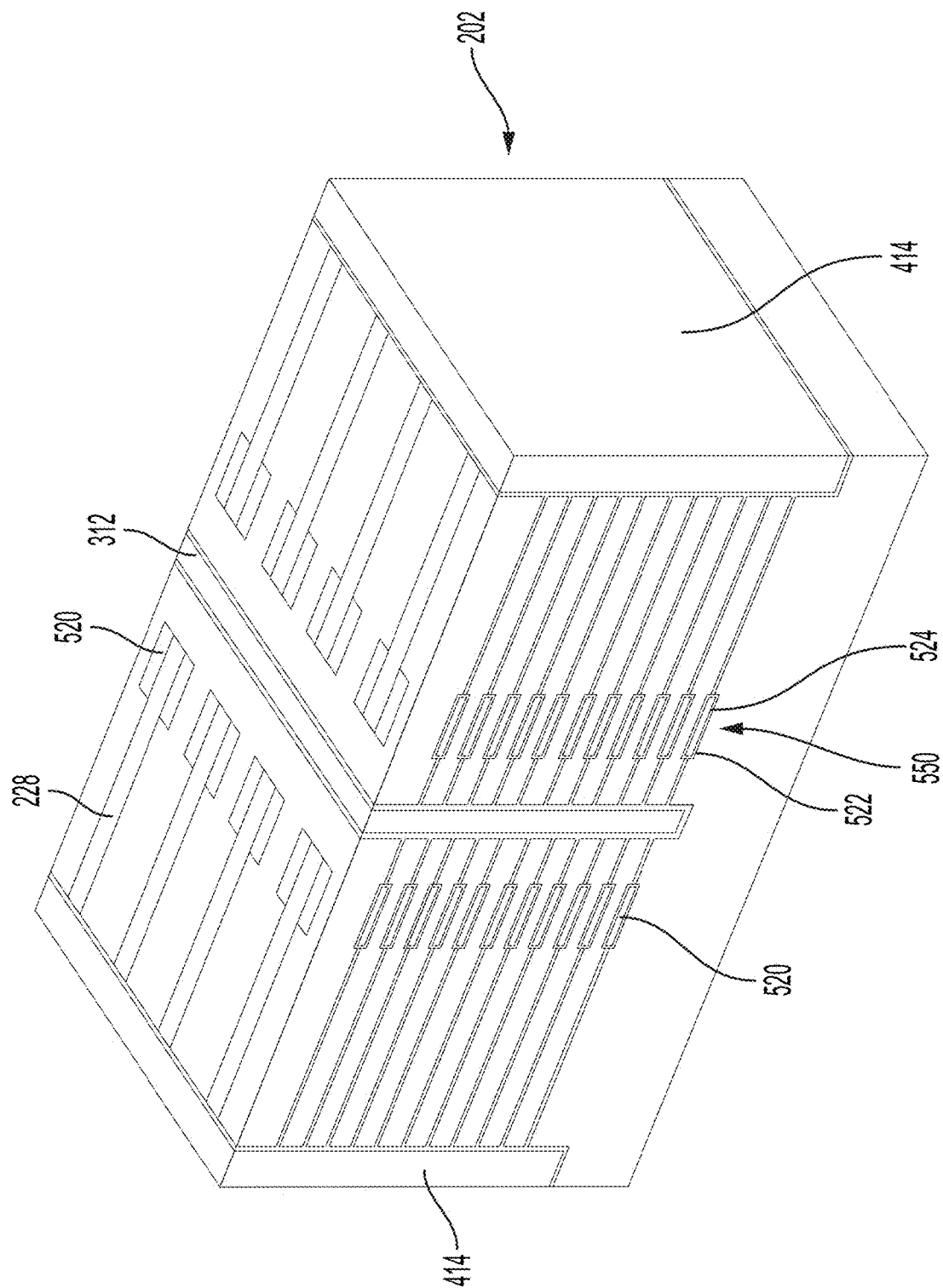
FIG. 5C depicts an isometric view of the first stack after depositing a conductive layer in recesses formed by lateral and vertical etch of the wordline replacement.

Forming the wordline feature, at 102F, comprises depositing a conductive layer 520 that wraps around the plurality of gate silicon channels to form the GAA structure of the 3d DRAM. FIG. 5C depicts an isometric view of the first stack 202 after depositing the conductive layer 520 in the horizontal recesses 510 or 510A and vertical recesses 508 formed by the SiGe lateral and vertical etch of the wordline replacement. In some embodiments, an outer layer 550 is disposed about the conductive layer 520. In some embodiments, the outer layer 550 includes a gate dielectric layer 522 that is deposited in the horizontal recesses 510 or 510A and the vertical recesses 508 prior to depositing the conductive layer 520. In some embodiments, the outer layer 550 includes a liner layer 524 that is deposited between the gate dielectric layer 522 and the conductive layer 520. In some embodiments, the liner layer 524 is disposed between the gate dielectric layer 522 and the conductive layer 520. The conductive layer 520 comprises any suitable metal, such as Tungsten. The gate dielectric layer 522 may comprise an oxide layer, such as, silicon oxide. The liner layer 524 may comprise a nitride layer, such as titanium nitride (TiN). One or more of the conductive layer 520, the gate dielectric layer 522, or the liner layer 524 may be deposited via a suitable CVD or ALD process.

Figure 6A:
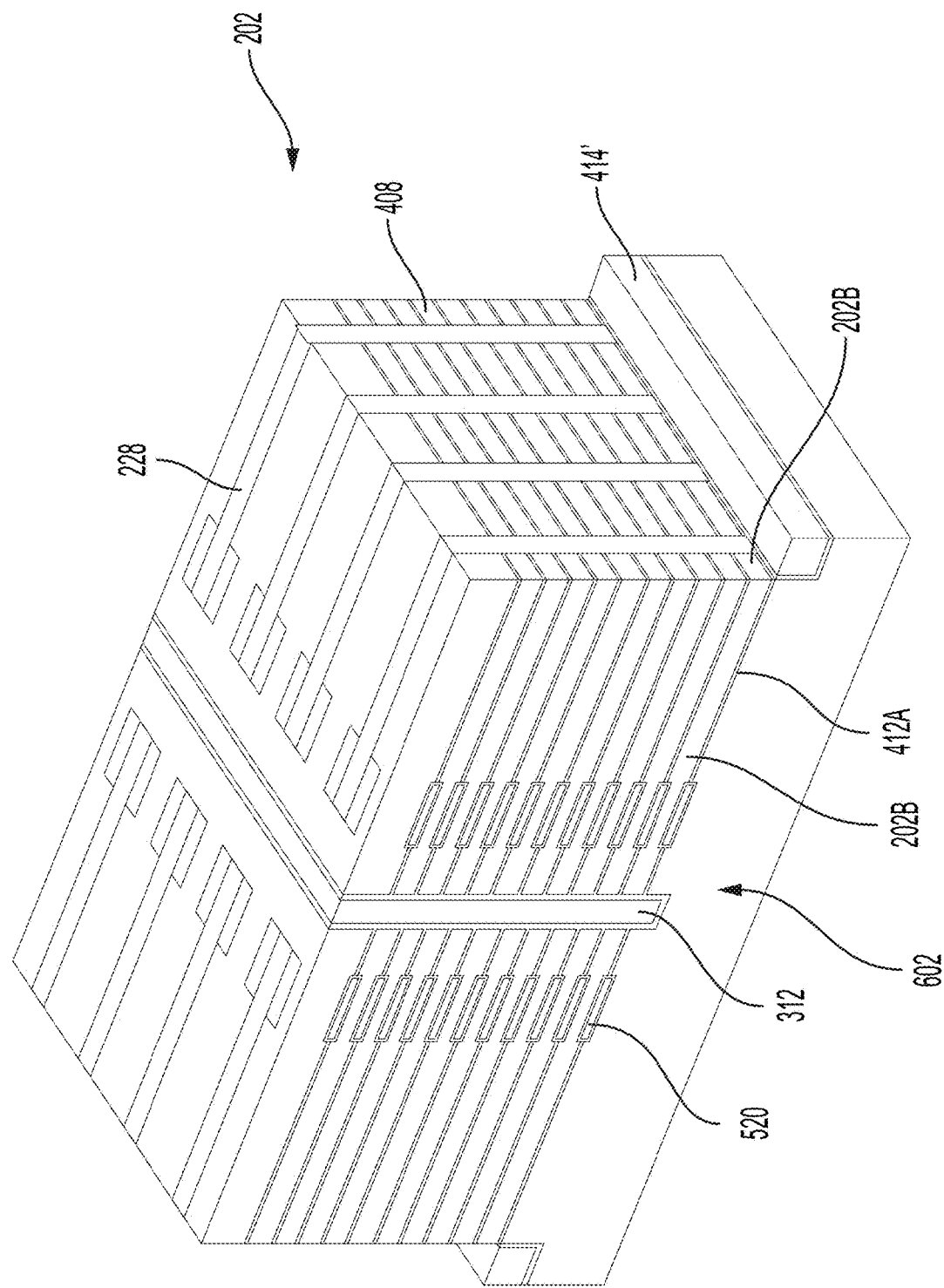
FIG. 6A depicts an isometric view of the first stack after performing a vertical etch of the capacitor slit in accordance with at least some embodiments of the present disclosure.

Referring back to 106, in some embodiments, forming the plurality of capacitor features comprises performing a lateral etch of the plurality of c-Si layers 202B from the capacitor slit 408 to expose source/drain doping regions (e.g., source/drain doping regions 602) of the 3D DRAM structure. In some embodiments, the lateral etch is performed on both sides of the capacitor slit 408. Prior to the lateral etch of the plurality of c-Si layers 202B, a hard mask may be placed on the first stack 202 and a vertical etch performed to etch the sacrificial fill 414 to expose the c-Si layers adjacent the capacitor slit 408. FIG. 6A depicts an isometric view of the first stack 202 after performing a vertical etch of the capacitor slit 408 in accordance with at least some embodiments of the present disclosure. In some embodiments, a partial sacrificial fill 414' may remain to protect the base c-Si layer 202A from unwanted etch. The partial sacrificial fill 414' generally extends at or below a lowermost capacitor isolation layer 412A so that the partial sacrificial fill 414' does not cover any of the c-Si layers 202B adjacent the capacitor slit 408.

Figure 6B:
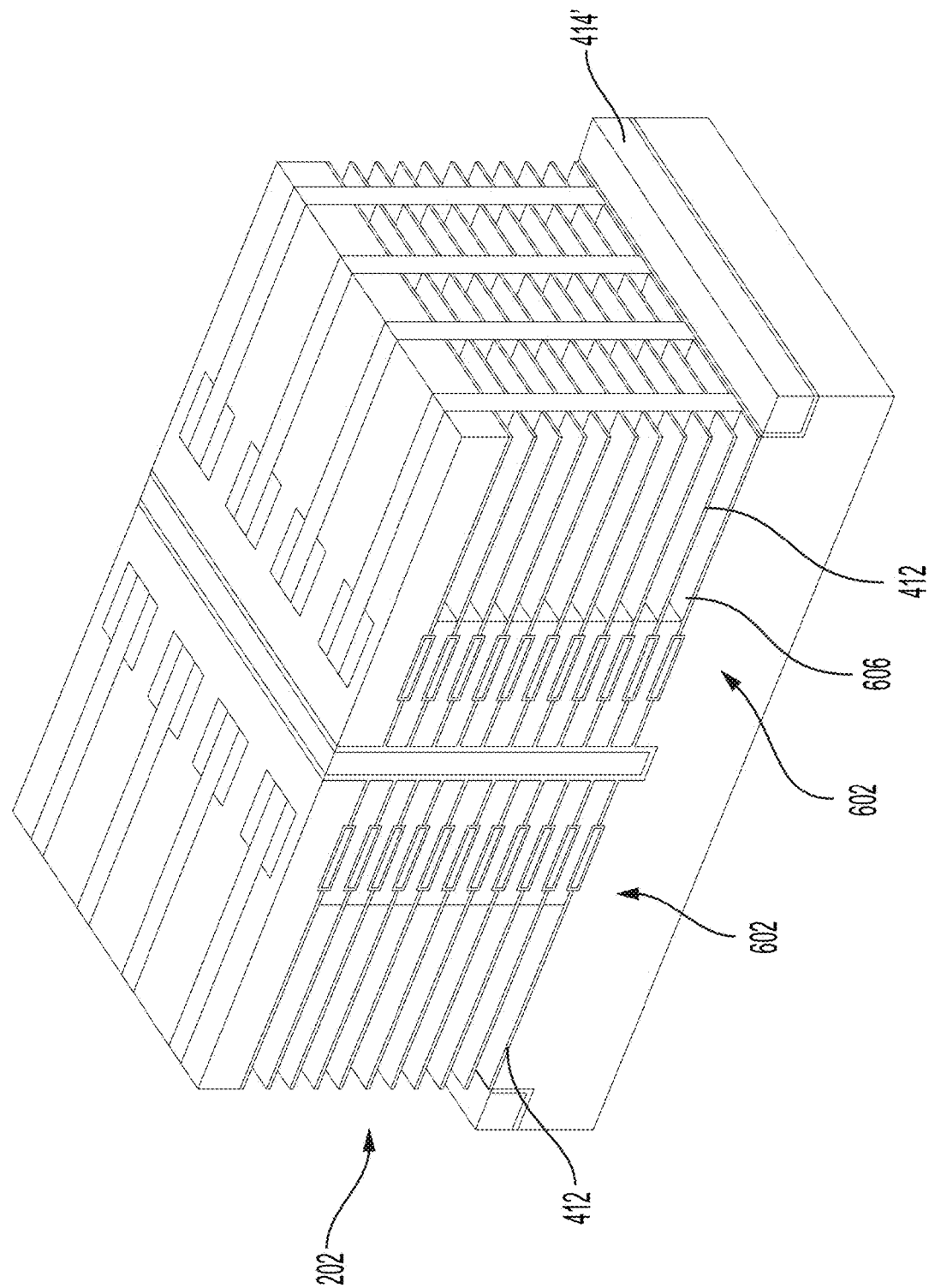
FIG. 6B depicts an isometric view of the first stack after performing a lateral etch from the capacitor slit for capacitor replacement in accordance with at least some embodiments of the present disclosure.
Figure 6C:
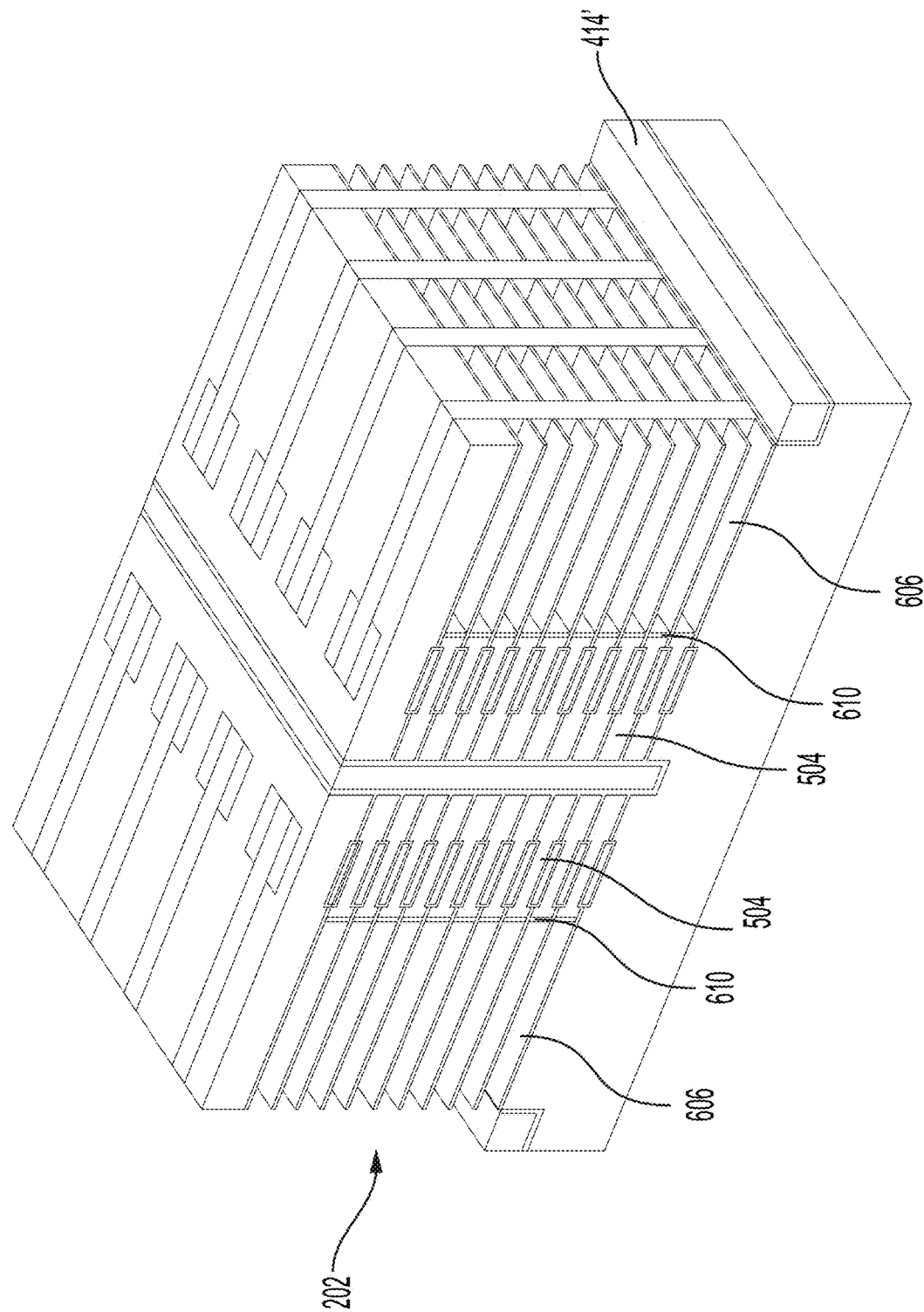
FIG. 6C depicts an isometric view of the first stack after performing a drain doping process in accordance with at least some embodiments of the present disclosure.

FIG. 6B depicts an isometric view of the first stack after performing a lateral etch from the capacitor slit 408 and forming recesses 606 for capacitor replacement in accordance with at least some embodiments of the present disclosure. In some embodiments, the lateral etch is an SRP process to selectively remove c-Si. The lateral etch may be configured to remove about 300 to about 800 nm of c-Si to expose the source/drain doping regions 602. FIG. 6C depicts an isometric view of the first stack 202 after performing a drain doping process in accordance with at least some embodiments of the present disclosure. After the drain doping process, the first stack 202 includes a drain 610 disposed between each of the plurality of gate silicon channels 504 and corresponding one of the recesses 606 disposed on a common horizontal plane. The drain doping process may include doping via selective epitaxy, plasma doping, or the like. The drain doping process may include doping the c-Si with any suitable material such as phosphorous. In some embodiments, a silicide layer 630 may be formed adjacent the drain 610. In some embodiments, the silicide layer 630 is formed via a selective reaction. In some embodiments, the silicide layer 630 consists essentially of titanium silicide (TiSi).

After the drain doping process, forming the capacitor features includes depositing a metal electrode layer (e.g., metal electrode layer 616) in at least a portion of the region where the plurality of c-Si layers are laterally etched from the capacitor slit (i.e., at least a portion of the recesses 606). The metal electrode layer 616 may comprise any suitable conductive material. In some embodiments, the capacitor features comprise a stack of alternating layers of the capacitor isolation layers 412 and the metal electrode layers 616.

In some embodiments, the metal electrode layers 616 are formed by depositing a first metal layer 632. In some embodiments, the metal electrode layers 616 include a first dielectric layer 634 deposited onto the first metal layer 632. In some embodiments, the metal electrode layers 616 include a second metal layer 638 deposited onto the first dielectric layer 634 (see also FIG. 9). In some embodiments, the second metal layer 638 may comprise a thin metal layer and a gap fill material that has low stress to facilitate expansion of the second metal layer 638 and stress relief. For example, the gap fill material may be boron doped SiGe, or the like.

Figure 6D:
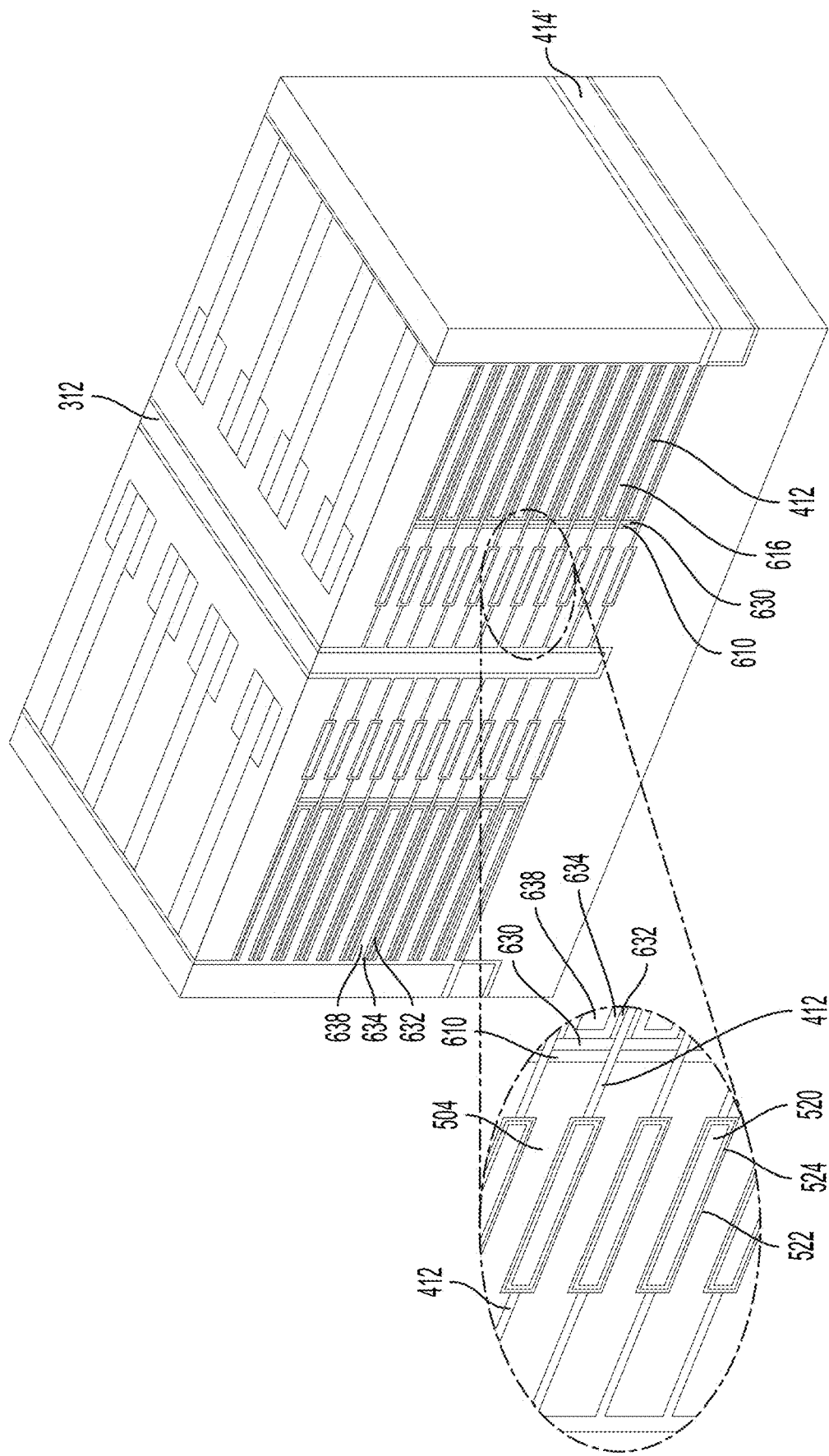
FIG. 6D depicts an isometric view of the first stack after performing a capacitor fill and capacitor gap fill process in accordance with at least some embodiments of the present disclosure.

In some embodiments, after filling the recesses 606, the capacitor slit 408 is fill with a sacrificial fill 614. In some embodiments, the sacrificial fill 614 comprises a similar material as the sacrificial fill 414. FIG. 6D depicts an isometric view of the first stack 202 after performing a capacitor recess fill and sacrificial fill process in accordance with at least some embodiments of the present disclosure.

Figure 7A:
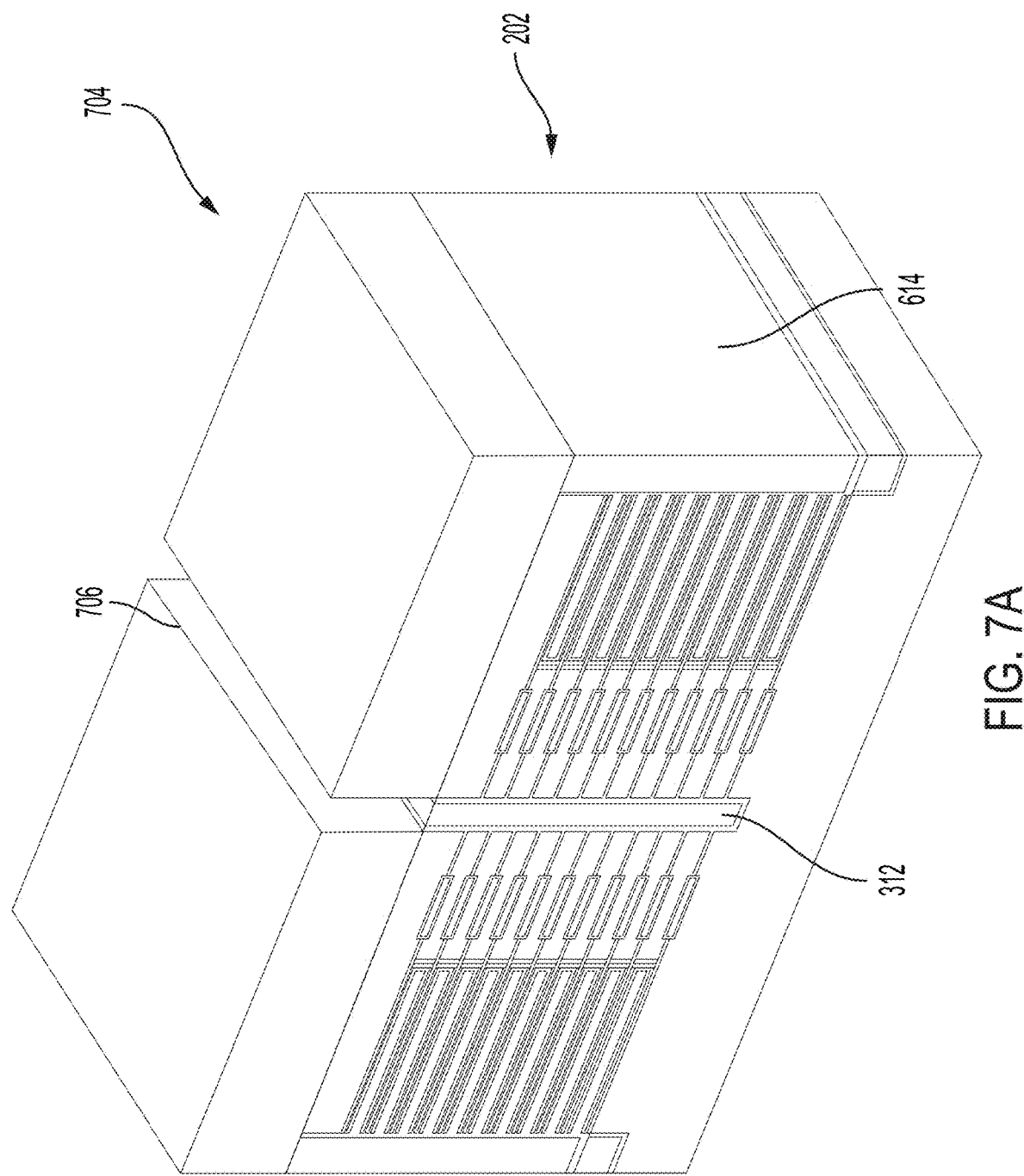
FIG. 7A depicts an isometric view of the first stack with a hard mask having a bitline slit in accordance with at least some embodiments of the present disclosure.
Figure 7C:
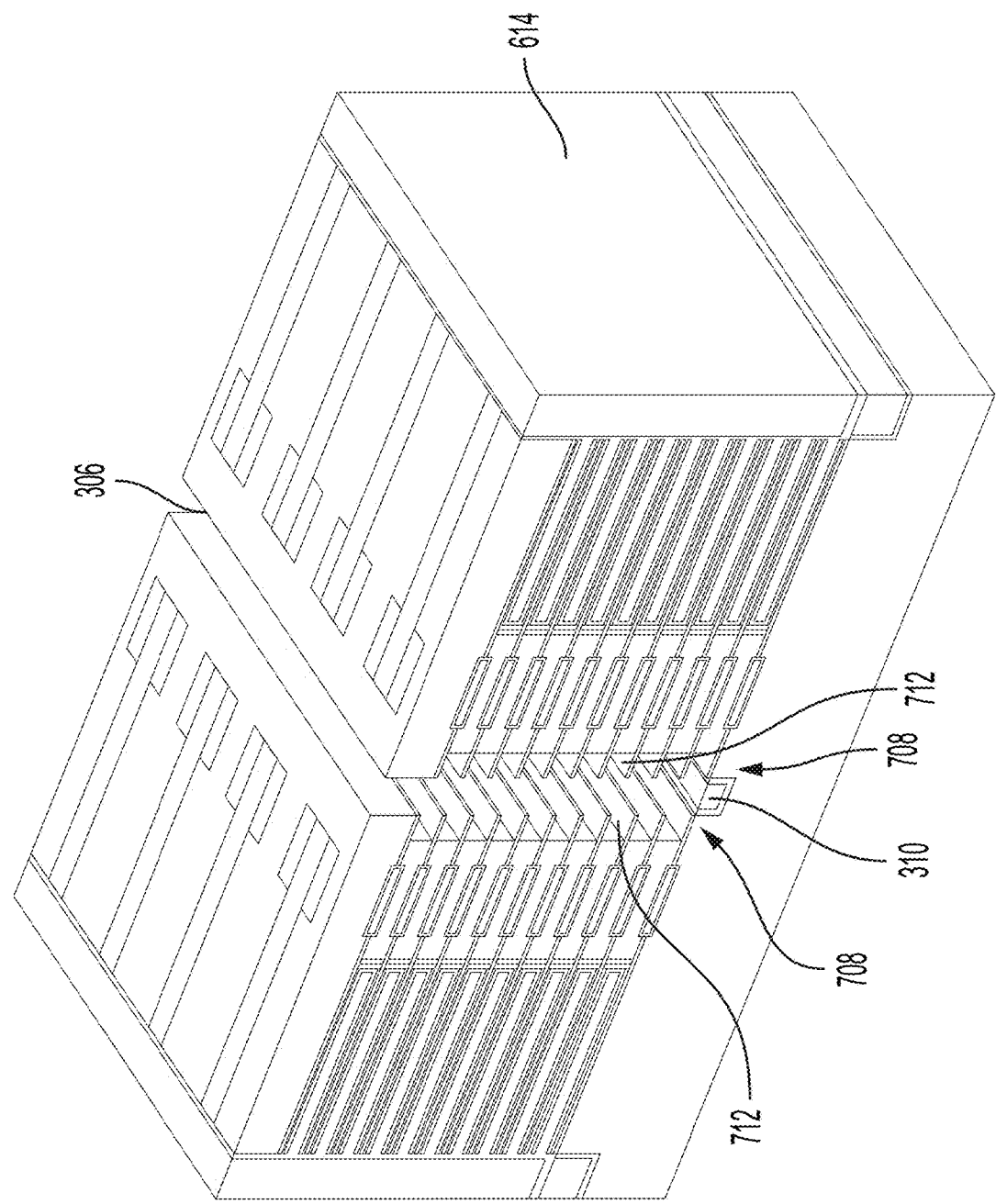
FIG. 7C depicts an isometric view of the first stack with a bitline slit lateral etch back process in accordance with at least some embodiments of the present disclosure.

Referring back to 104, in some embodiments, forming the bitline feature further comprises performing a lateral etch of the plurality of c-Si layers 202B from the bitline slit 306 to expose source/drain doping regions (e.g., source/drain doping regions 708) of the 3D DRAM structure. In some embodiments, the lateral etch is performed on both sides of the bitline slit 306. Prior to performing the lateral etch, a vertical etch of the sacrificial fill 312 is performed to at least partially remove the sacrificial fill 312 to expose the c-Si layers 202B from the bitline slit 306. FIG. 7A depicts an isometric view of the first stack 202 with a hard mask 704 having a bitline slit 706 in accordance with at least some embodiments of the present disclosure. The bitline slit 706 exposes the sacrificial fill 312. FIG. 7B depicts an isometric view of the first stack 202 after a vertical bitline slit etch process in accordance with at least some embodiments of the present disclosure. A partial sacrificial fill 312' may be left to protect the base c-Si layer 202A. FIG. 7C depicts an isometric view of the first stack 202 with a bitline slit lateral etch back process in accordance with at least some embodiments of the present disclosure. The bitline slit lateral etch back forms recesses 712 between bitline isolation layers 310 that expose the source/drain doping regions 708. In some embodiments, the bitline slit lateral etch comprises selectively removing about 30 to about 80 nm of c-Si laterally from the bitline slit 306.

Figure 7D:
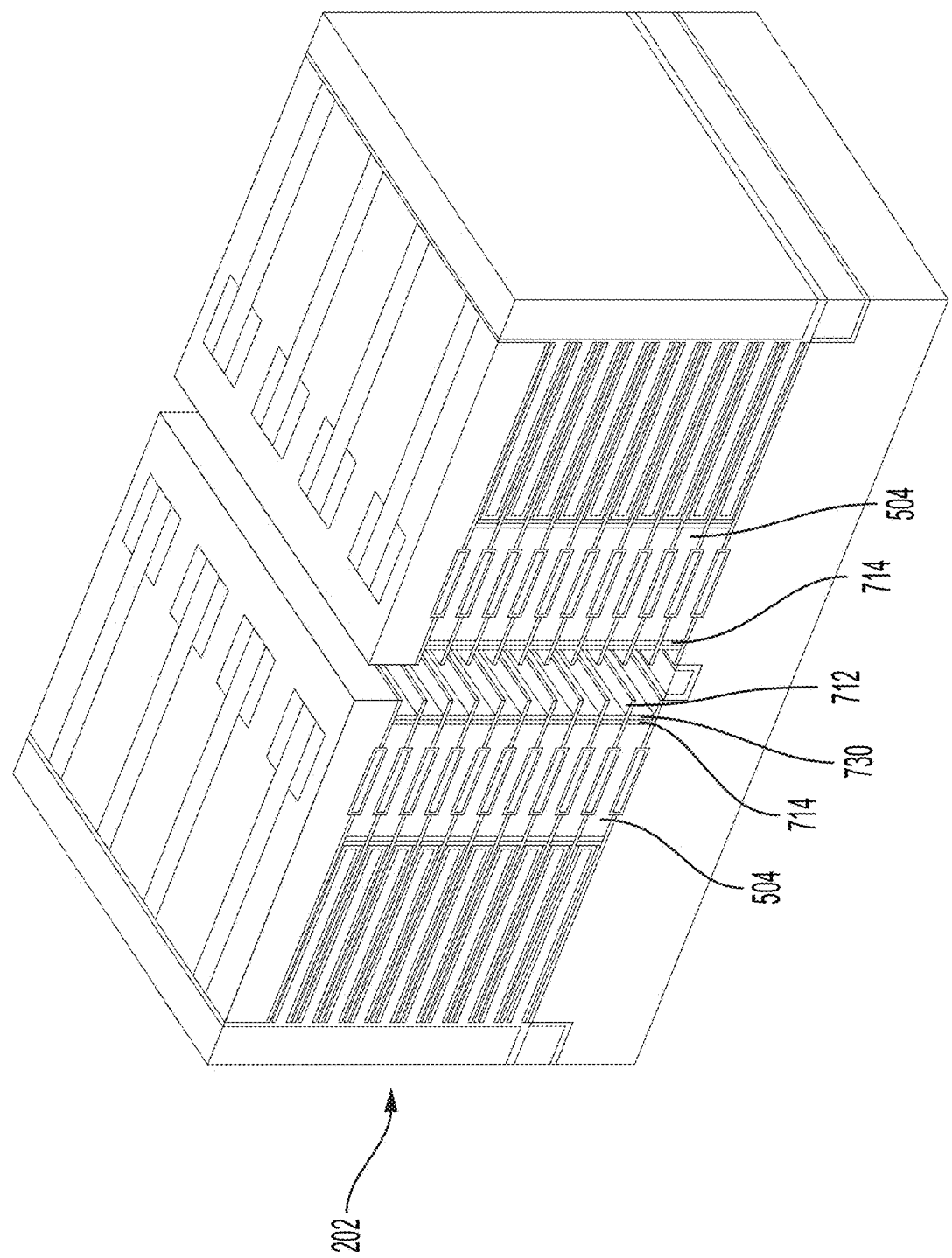
FIG. 7D depicts an isometric view of the first stack with bitline source doping in accordance with at least some embodiments of the present disclosure.

FIG. 7D depicts an isometric view of the first stack 202 with bitline source doping in accordance with at least some embodiments of the present disclosure. After the source doping process, the first stack 202 includes a source 714 disposed between each of the plurality of gate silicon channels 504 and a corresponding one of the recesses 712 that is disposed on a common horizontal plane. The source doping process may include doping via selective epitaxy, plasma doping, or the like. The source doping process may include doping the c-Si with any suitable material such as phosphorous. In some embodiments, a silicide layer 730 may be formed adjacent the source 714. In some embodiments, the silicide layer 730 is formed via a selective reaction. In some embodiments, the silicide layer 730 consists essentially of titanium silicide (TiSi).

Figure 7E:
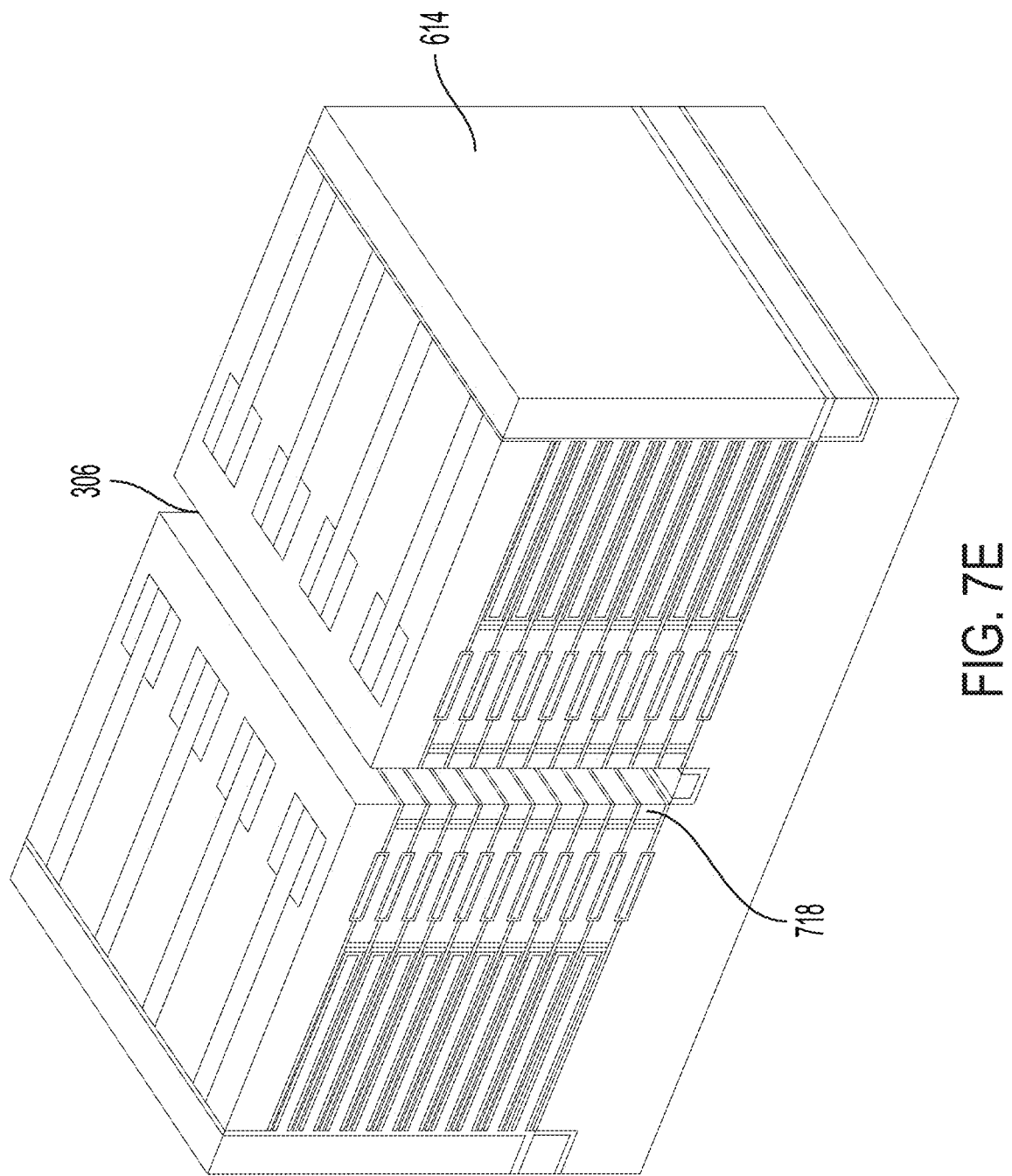
FIG. 7E depicts an isometric view of the first stack with bitline metal deposition in accordance with at least some embodiments of the present disclosure.

Forming the bitline feature further comprises depositing a metal layer (e.g., bitline metal layer 718) in at least a portion of the region where the plurality of c-Si layers are laterally etched from the bitline slit (i.e., depositing a metal layer in at least a portion of the recesses 712). FIG. 7E depicts an isometric view of the first stack with bitline metal deposition in accordance with at least some embodiments of the present disclosure. The bitline metal layer 718 may comprise a material similar to the conductive layer 520.

Figure 7F:
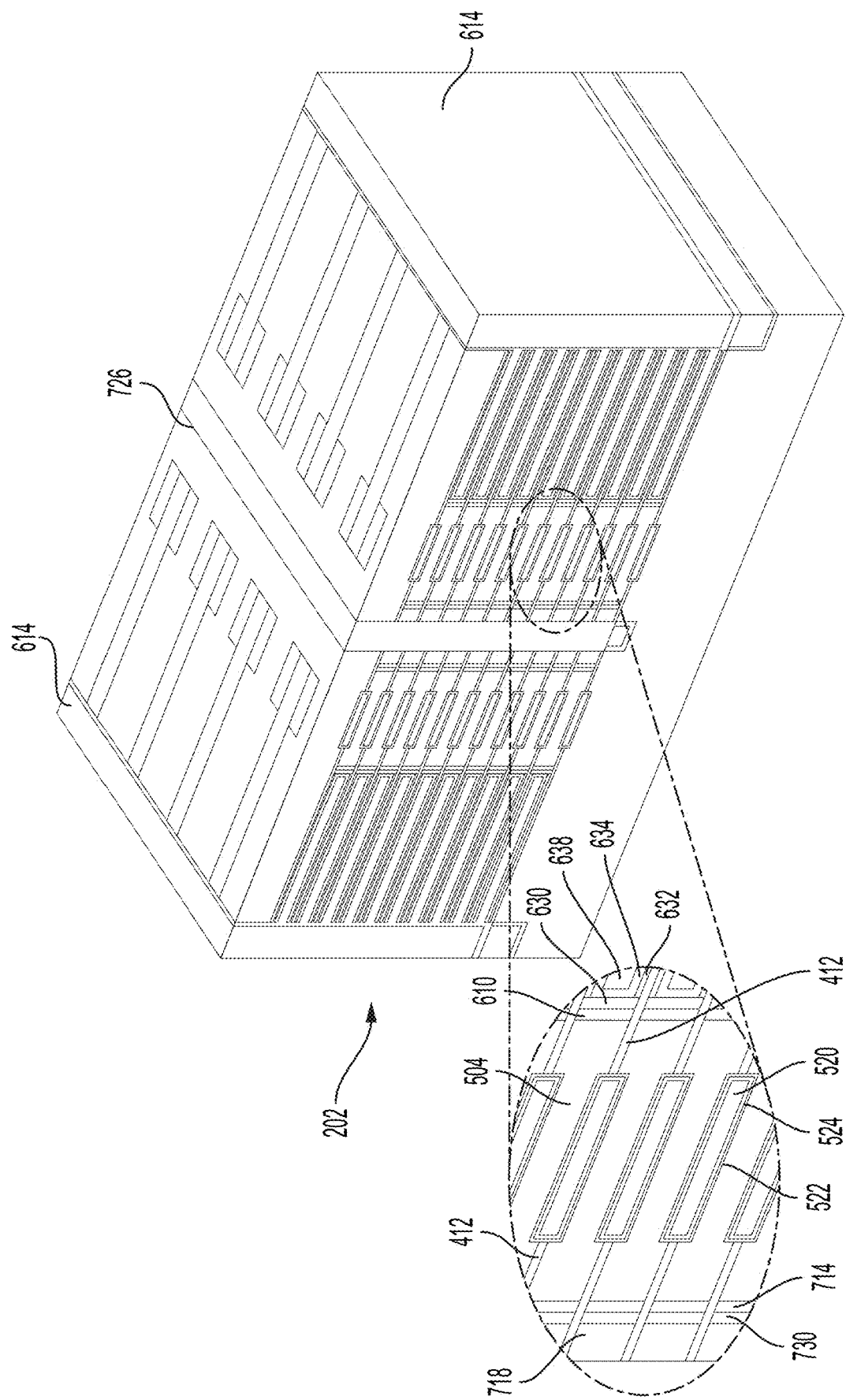
FIG. 7F depicts an isometric view of the first stack with gap fill of the bitline slit in accordance with at least some embodiments of the present disclosure.

In some embodiments, after filling the recesses 712, the bitline slit 306 is fill with a sacrificial fill 726. In some embodiments, the sacrificial fill 726 comprises a similar material as the sacrificial fill 312. FIG. 7F depicts an isometric view of the first stack 202 with gap fill of the bitline slit 306 in accordance with at least some embodiments of the present disclosure. Before or after any of the processing steps disclosed herein, a planarization process may be performed to smoothen any surface of the first stack 202, for example, before or after any etch or gap fill process.

Figure 8:
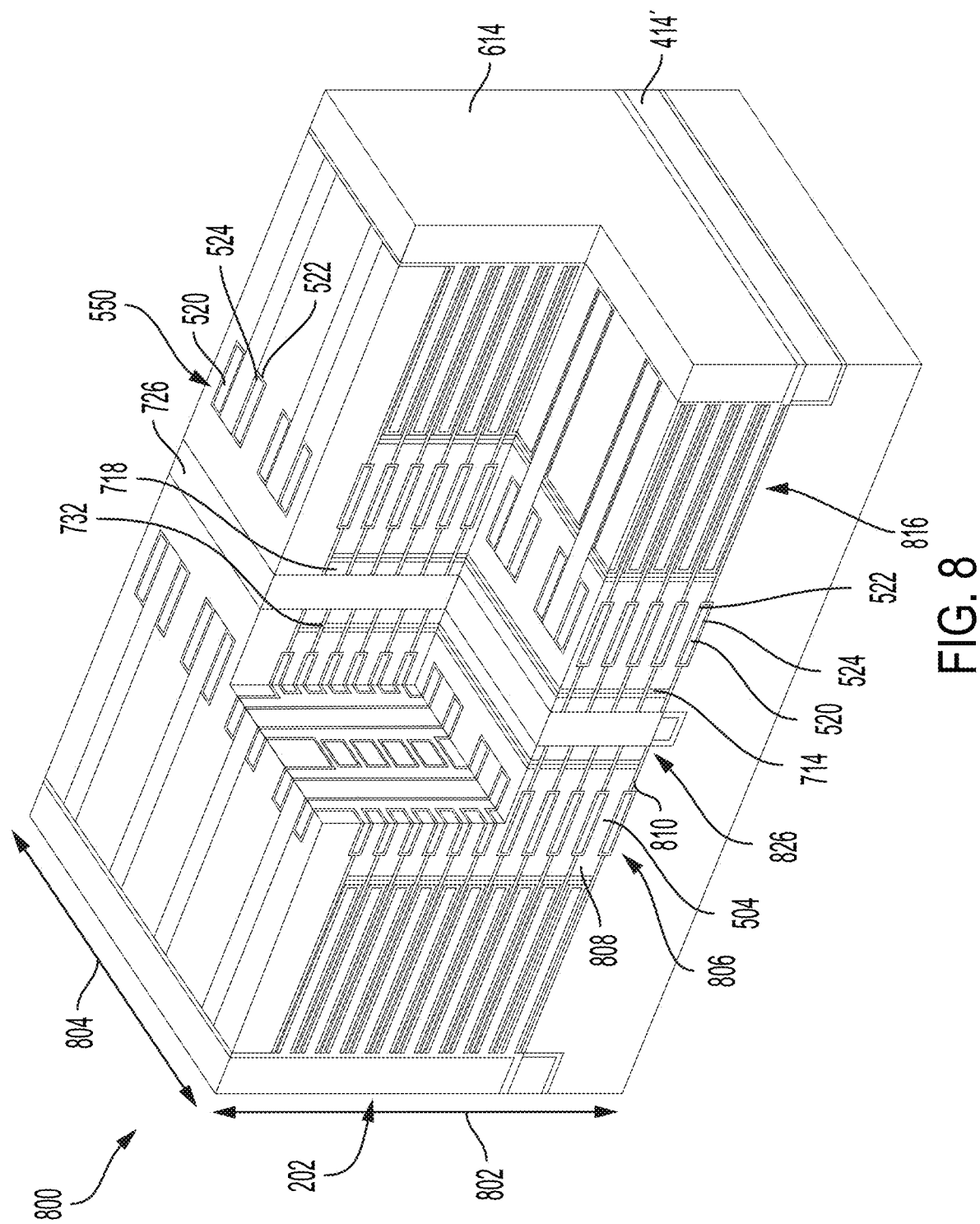
FIG. 8 depicts an isometric cutaway view of a portion of a three-dimensional dynamic random-access memory (3D DRAM) structure in accordance with at least some embodiments of the present disclosure.

FIG. 8 depicts an isometric cutaway view of a portion of a three-dimensional dynamic random-access memory (3D DRAM) structure 800 in accordance with at least some embodiments of the present disclosure. In some embodiments, the 3D DRAM structure 800 is formed via the process described above and shown via FIGS. 2A through 7F. The 3D DRAM structure 800 include at least one vertical wordline feature 806 of the 3D DRAM structure formed in a first stack 202 of alternating crystalline silicon (c-Si) layers 808 and nitride layers 810. The at least one vertical wordline feature 806 extends in a vertical direction 802. The at least one vertical wordline feature 806 includes the plurality of gate silicon channels 504 comprising the plurality of c-Si layers 202B, the gate dielectric layer 522 wrapped around each of the plurality of gate silicon channels 504, and the conductive layer 520 wrapped around the gate dielectric layer 522 to form a gate-all-around (GAA) structure. In some embodiments, the liner layer 524 is disposed between the gate dielectric layer 522 and the conductive layer 520. In some embodiments, the liner layer 524 is made of a nitride layer and the gate dielectric layer 522 is made of an oxide layer.

In some embodiments, at least one horizontal bitline feature 826 extends in a horizontal direction 804 perpendicular to the at least one vertical wordline feature 806. A plurality of capacitor features 816 extend horizontally from the at least one vertical wordline 806 between the capacitor isolation layers 412. In some embodiments, the source 714 is disposed between the at least one vertical wordline and the at least one horizontal bitline and the drain is disposed between the at least one vertical wordline and the plurality of capacitors. In some embodiments, the at least one horizontal bitline features 826 comprises a plurality of alternating layers of bitline metal layers 718 and bitline isolation layers 732. In some embodiments, the plurality of bitline metal layers 718 are vertically aligned with the source 714.

While the foregoing is directed to embodiments of the present disclosure, other and further embodiments of the disclosure may be devised without departing from the basic scope thereof.

The invention claimed is:

1. A method of forming a three-dimensional dynamic random-access memory (3D DRAM) structure, comprising:
   forming at least one wordline feature in a first stack comprising a plurality of crystalline silicon (c-Si) layers alternating with a plurality of crystalline silicon germanium (c-SiGe) layers, wherein the wordline feature comprises:
   vertically etching a first pattern of holes through the first stack;
   filling the first pattern of holes with a silicon germanium fill having a concentration of germanium similar to a concentration of germanium in the plurality of c-SiGe layers;
   vertically etching a plurality of isolation slots through the first stack, splitting the silicon germanium fill in each of the first pattern of holes;
   filling the plurality of isolation slots with a dielectric material to form an isolation layer between the silicon germanium fill;
   etching the silicon germanium fill and the plurality of c-SiGe layers to form a plurality of gate silicon channels comprising portions of the plurality of c-Si layers; and
   depositing a layer of conductive material that wraps around the plurality of gate silicon channels.

2. The method of claim 1, further comprising depositing the first stack onto a substrate using a heteroepitaxy process.

3. The method of claim 1, further comprising depositing a gate dielectric layer around the plurality of gate silicon channels prior to depositing the layer of conductive material.

4. The method of claim 1, wherein the silicon germanium fill comprises amorphous silicon germanium deposited via a chemical vapor deposition (CVD) process.

5. The method of claim 1, further comprising forming a bitline feature through the first stack extending between rows of the first pattern of holes.

6. The method of claim 5, wherein forming the bitline feature comprises:
   etching a bitline slit through the first stack;
   performing a lateral etch of the plurality of c-Si layers from the bitline slit to expose source/drain doping regions of the 3D DRAM structure; and
   depositing a metal layer in at least a portion of a region where the plurality of c-Si layers are laterally etched from the bitline slit.

7. The method of claim 1, further comprising forming a plurality of capacitor features in the first stack.

8. The method of claim 7, wherein forming the plurality of capacitor features comprises:
   etching a capacitor slit through the first stack;
   performing a lateral etch of the plurality of c-Si layers from the capacitor slit to expose source/drain doping regions of the 3D DRAM structure; and
   depositing a metal electrode layer in at least a portion of a region where the plurality of c-Si layers are laterally etched from the capacitor slit.

9. The method of claim 1, further comprising etching the plurality of c-Si layers to widen a gap between the plurality of c-Si layers.

10. A method of forming a three-dimensional dynamic random-access memory (3D DRAM) structure, comprising:
    forming a wordline feature in a first stack comprising a plurality of crystalline silicon (c-Si) layers alternating with a plurality of crystalline silicon germanium (c-SiGe) layers, wherein the wordline feature comprises:
    vertically etching a first pattern of holes through the first stack;
    filling the first pattern of holes with a silicon germanium fill having a concentration of germanium similar to a concentration of germanium in the plurality of c-SiGe layers;
    vertically etching a plurality of isolation slots through the first stack, splitting the silicon germanium fill in each of the first pattern of holes;
    filling the plurality of isolation slots with a dielectric material to form an isolation layer between the silicon germanium fill;
    etching the silicon germanium fill and the plurality of c-SiGe layers to form a plurality of gate silicon channels comprising portions of the plurality of c-Si layers; and
    depositing a layer of conductive material that wraps around the plurality of gate silicon channels;
    forming a bitline feature through the first stack extending between rows of the first pattern of holes; and
    forming a plurality of capacitor features in the first stack.

11. The method of claim 10, further comprising depositing a gate dielectric layer around the plurality of gate silicon channels and depositing a liner layer on the gate dielectric layer prior to depositing the layer of conductive material.

12. The method of claim 10, wherein the silicon germanium fill comprises amorphous silicon germanium deposited via a chemical vapor deposition (CVD) process.

13. The method of claim 10, wherein forming the bitline feature comprises:
 etching a bitline slit through the first stack;
 performing a lateral etch of the plurality of c-SiGe layers from the bitline slit;
 depositing bitline isolation layers in recesses formed by the lateral etch of the plurality of c-SiGe layers;
 performing a lateral etch of the plurality of c-Si layers from the bitline slit to expose source/drain doping regions of the 3D DRAM structure; and
 depositing a metal layer in at least a portion of a region where the plurality of c-Si layers are laterally etched from the bitline slit.

14. The method of claim 10, wherein forming the plurality of capacitor features comprises:
 etching a capacitor slit through the first stack;
 performing a lateral etch of the plurality of c-SiGe layers from the capacitor slit;
 depositing capacitor isolation layers in recesses formed by the lateral etch of the plurality of c-SiGe layers;
 performing a lateral etch of the plurality of c-Si layers from the capacitor slit to expose source/drain doping regions of the 3D DRAM structure; and
 depositing a metal electrode layer in at least a portion of a region where the plurality of c-Si layers are laterally etched from the capacitor slit.

* * * * *